US012812962B2

(12) United States Patent
Lee et al.

(10) Patent No.: US 12,812,962 B2
(45) Date of Patent: Nov. 24, 2026

(54) SEMICONDUCTOR DEVICE WITH ISOLATION STRUCTURES

(71) Applicant: Taiwan Semiconductor Manufacturing Co., Ltd., Hsinchu (TW)

(72) Inventors: Pei-Wei Lee, Hsinchu (TW); Pang-Yen Tsai, Jhu-bei City (TW); Tsungyu Hung, Hsinchu City (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 639 days.

(21) Appl. No.: 18/232,171

(22) Filed: Aug. 9, 2023

(65) Prior Publication Data

US 2023/0386925 A1 Nov. 30, 2023

Related U.S. Application Data

(62) Division of application No. 17/006,161, filed on Aug. 28, 2020, now Pat. No. 11,830,773.

(Continued)

(51) Int. Cl.
*H10D 84/03* (2025.01)
*H10D 30/01* (2025.01)

(Continued)

(52) U.S. Cl.
CPC ......... *H10D 84/038* (2025.01); *H10D 30/024* (2025.01); *H10D 30/62* (2025.01); *H10D 30/6735* (2025.01); *H10D 62/121* (2025.01); *H10D 84/0158* (2025.01); *H10P 14/3444* (2026.01); *H10P 90/1914* (2026.01); *H10W 10/011* (2026.01); *H10W 10/061* (2026.01);

(Continued)

(58) Field of Classification Search
CPC ............. H10D 84/038; H10D 84/0158; H10D 62/121; H10D 62/118; H10D 30/014; H10D 30/024; H10D 30/43; H10D 30/62; H10D 30/6735; H10W 10/061; H10W 10/10; H10W 10/181

See application file for complete search history.

(56) References Cited

U.S. PATENT DOCUMENTS

| | | | | |
|---|---|---|---|---|
| 5,681,775 A * | 10/1997 | Pogge | H10P 90/1906 | 148/DIG. 12 |
| 5,780,311 A * | 7/1998 | Beasom | H10P 90/1906 | 438/455 |

(Continued)

*Primary Examiner* — Tuan A Hoang
(74) *Attorney, Agent, or Firm* — Sterne, Kessler, Goldstein & Fox P.L.L.C.

(57) ABSTRACT

A method of fabricating a semiconductor device with superlattice structures on a substrate with an embedded isolation structure is disclosed. The method includes forming an etch stop layer on a substrate, forming a superlattice structure on the etch stop layer, depositing an isolation layer on the superlattice structure, depositing a semiconductor layer on the isolation layer, forming a bi-layer isolation structure on the semiconductor layer, removing the substrate and the etch stop layer, etching the superlattice structure, the isolation layer, the semiconductor layer, and the bi-layer isolation structure to form a fin structure, and forming a gate-all-around structure on the fin structure.

20 Claims, 19 Drawing Sheets

Related U.S. Application Data

(60) Provisional application No. 62/981,801, filed on Feb. 26, 2020.

(51) Int. Cl.

| | |
|---|---|
| ***H10D 30/62*** | (2025.01) |
| ***H10D 30/67*** | (2025.01) |
| ***H10D 62/10*** | (2025.01) |
| ***H10D 84/01*** | (2025.01) |
| ***H10P 14/20*** | (2026.01) |
| ***H10P 90/00*** | (2026.01) |
| ***H10W 10/00*** | (2026.01) |
| ***H10W 10/10*** | (2026.01) |

(52) U.S. Cl.

CPC ......... *H10W 10/10* (2026.01); *H10W 10/181* (2026.01); *H10D 30/6219* (2025.01); *H10D 62/118* (2025.01)

(56) References Cited

U.S. PATENT DOCUMENTS

| | | | | |
|---|---|---|---|---|
| 7,495,250 | B2 | 2/2009 | Enicks | |
| 9,318,553 | B1 * | 4/2016 | Cheng | H10D 30/014 |
| 2004/0000268 | A1 * | 1/2004 | Wu | H10P 14/3251<br>257/E21.129 |
| 2013/0341704 | A1 * | 12/2013 | Rachmady | H10D 62/122<br>977/890 |
| 2014/0312432 | A1 | 10/2014 | Ching et al. | |
| 2017/0005195 | A1 * | 1/2017 | Ching | H10D 30/014 |
| 2021/0265220 | A1 | 8/2021 | Lee et al. | |

* cited by examiner

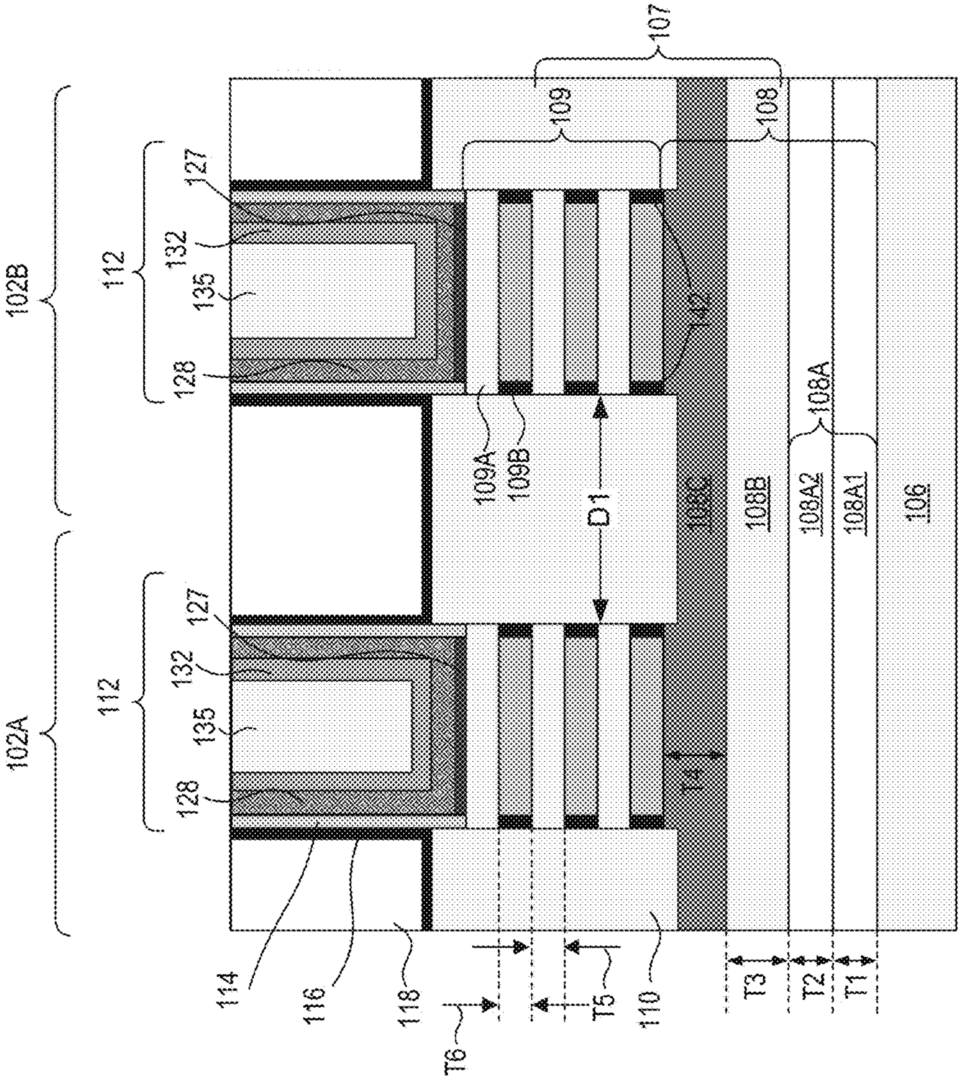
Fig. 1B
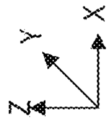

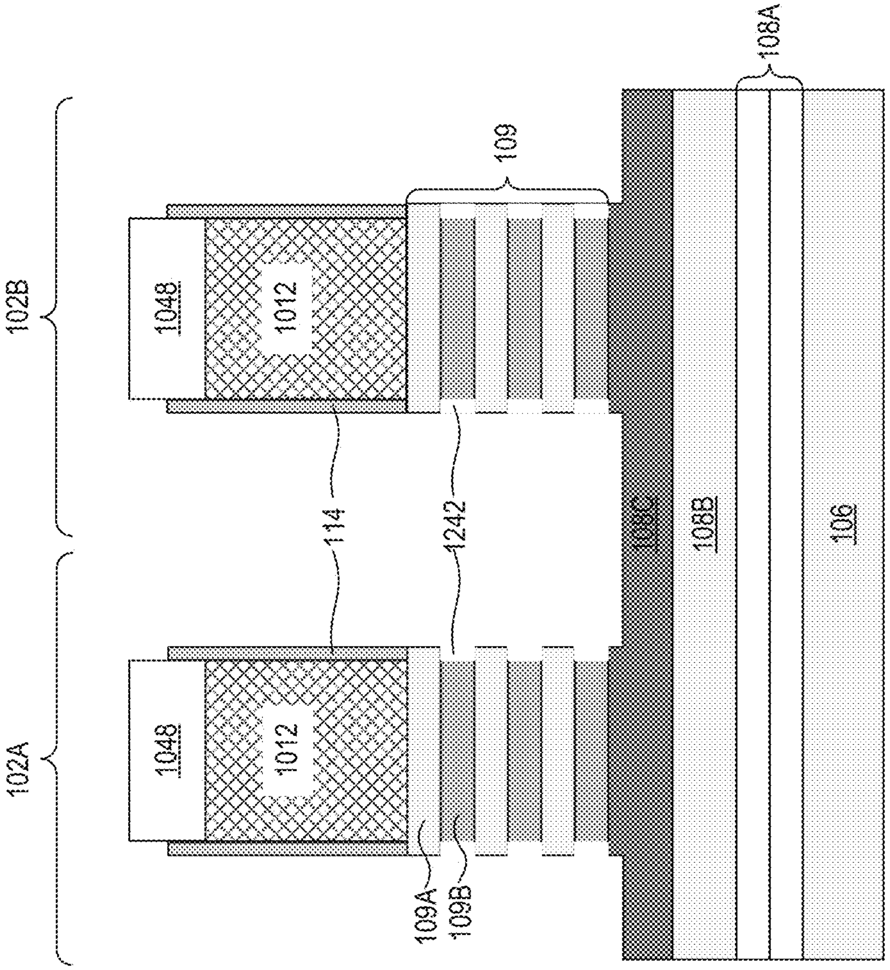
Fig. 12
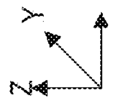

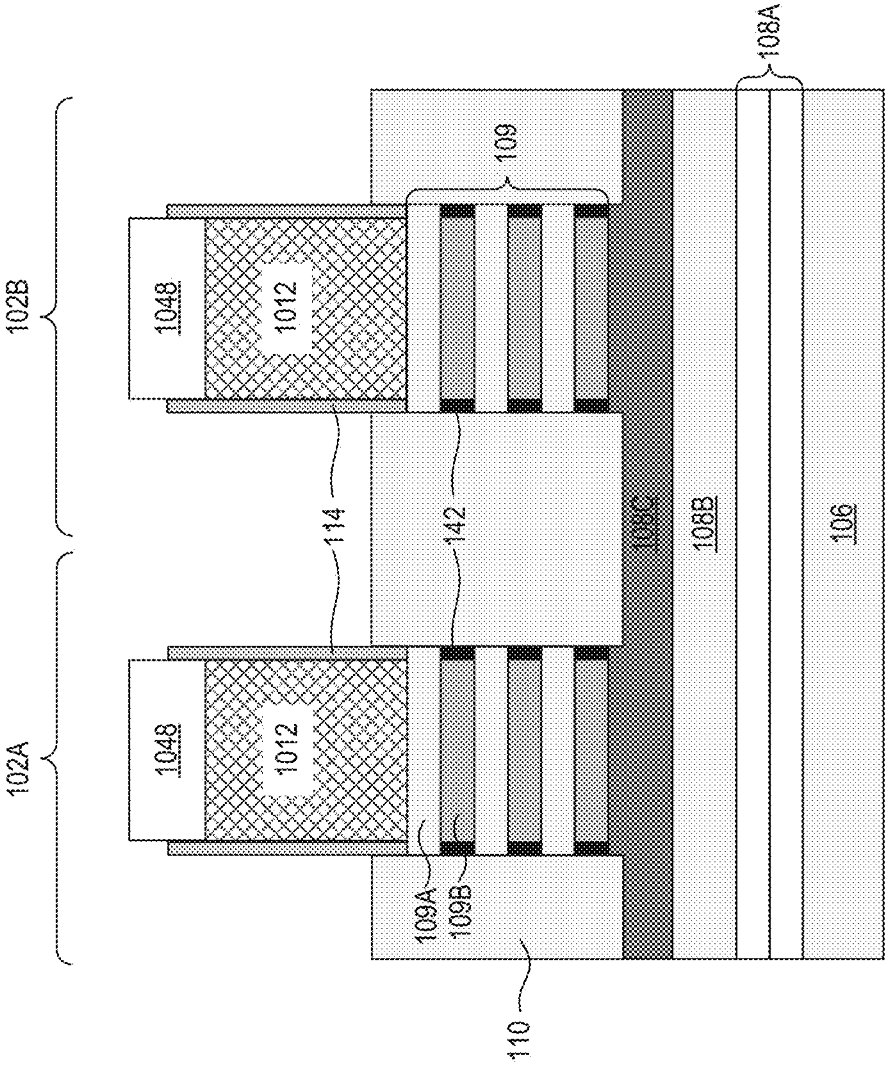
Fig. 14
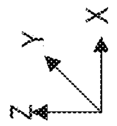

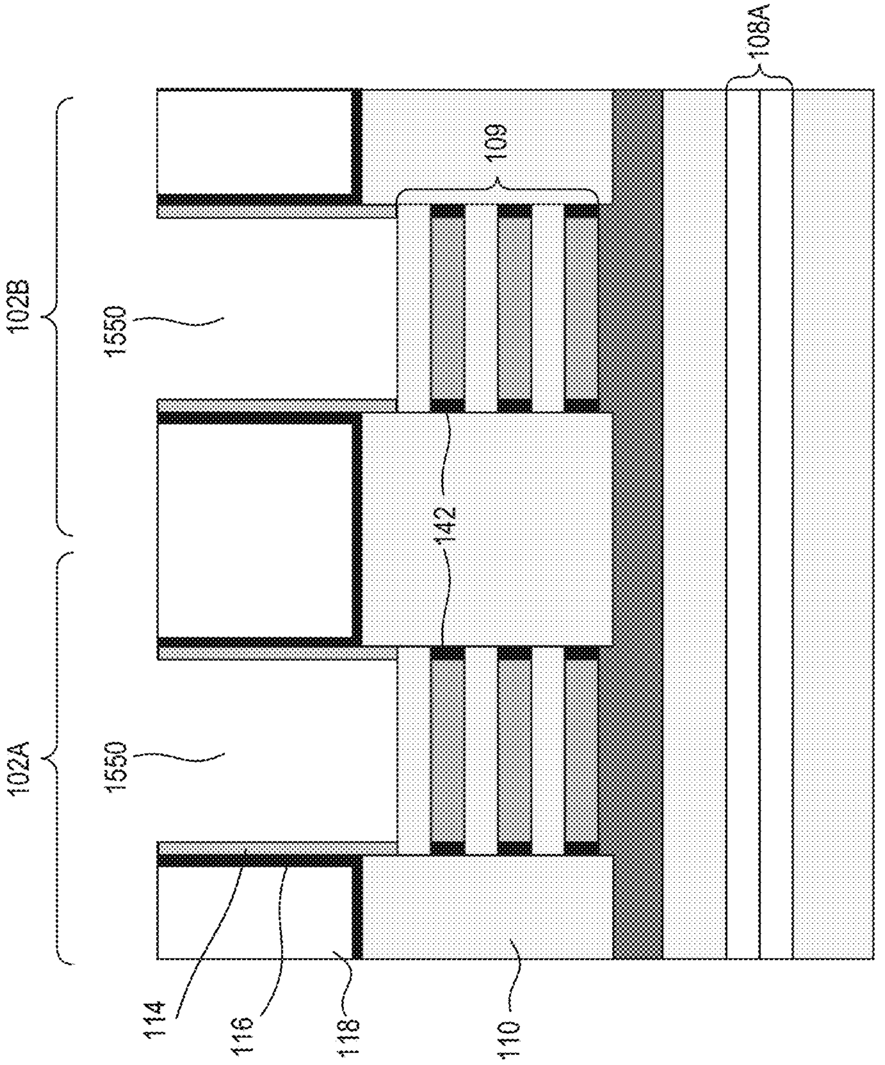
Fig. 15
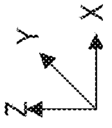

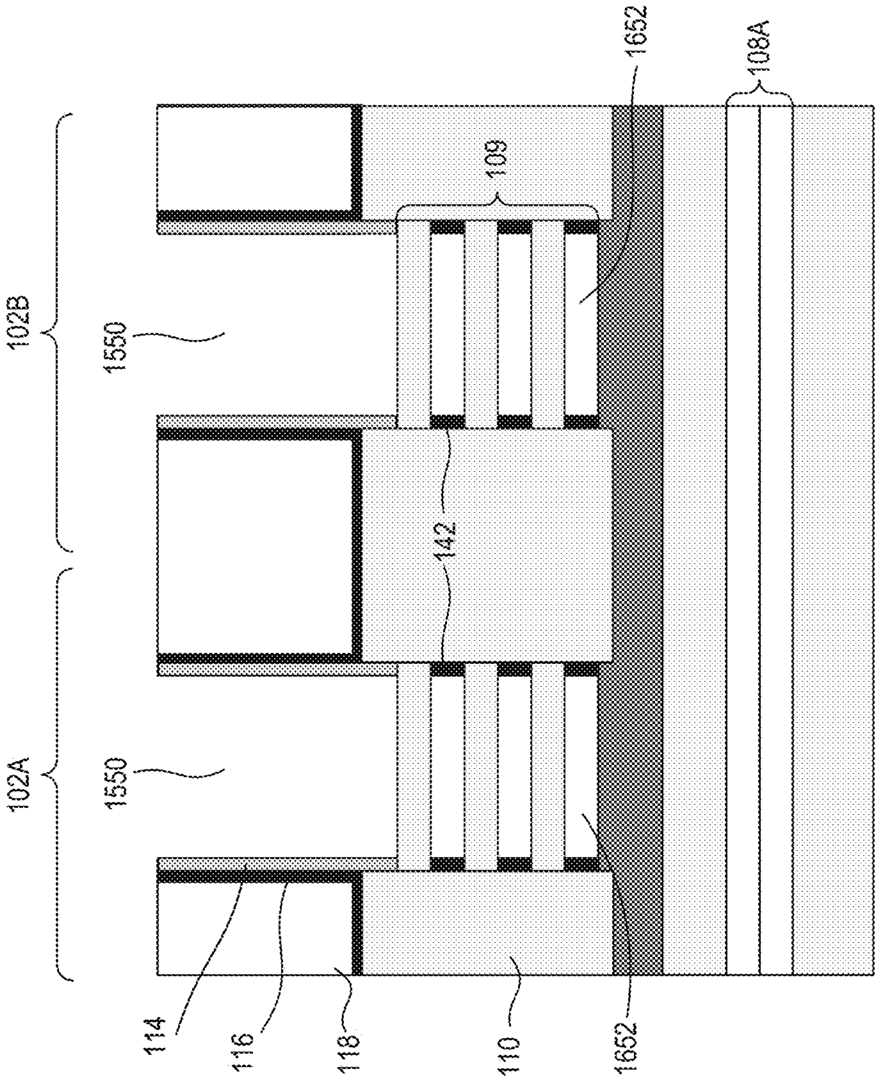
Fig. 16
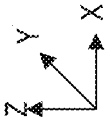

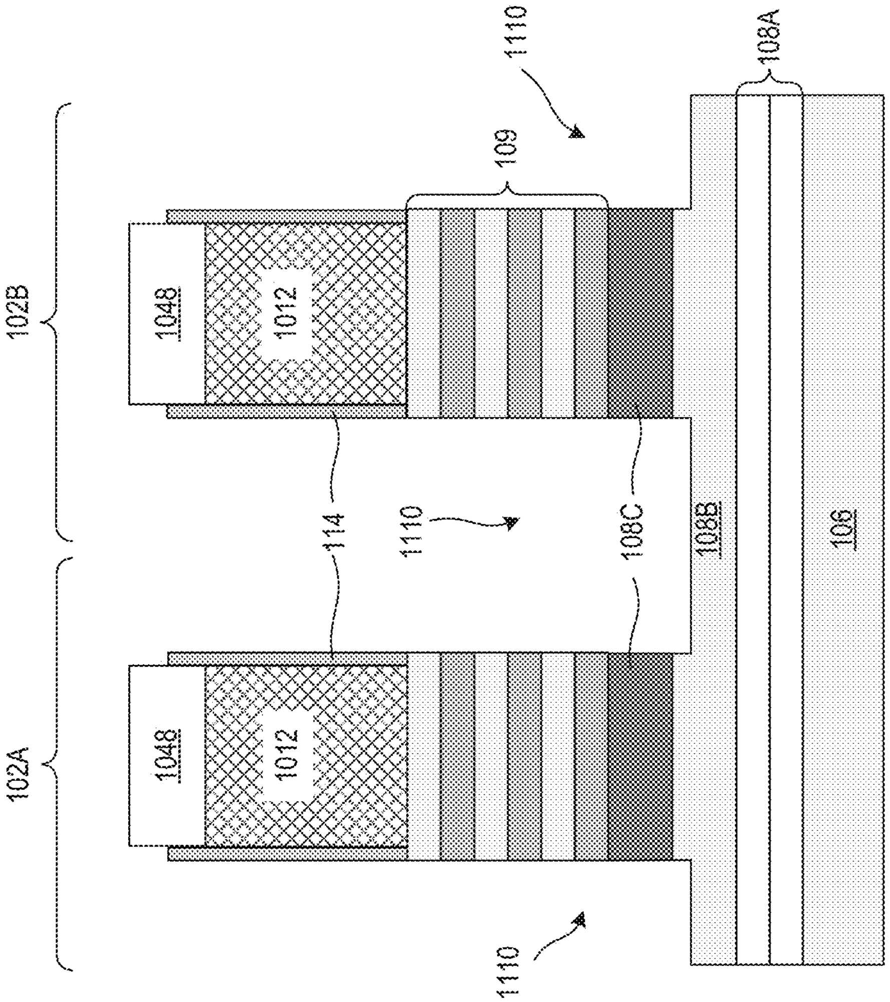
Fig. 18
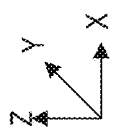

SEMICONDUCTOR DEVICE WITH ISOLATION STRUCTURES

CROSS-REFERENCE TO RELATED APPLICATIONS

This application is a divisional of U.S. patent application Ser. No. 17/006,161, titled "Semiconductor Devices with Isolation Structures," filed Aug. 28, 2020, which claims the benefit of U.S. Provisional Patent Application No. 62/981,801 titled "Methods of Fabricating Semiconductor Devices on Silicon-on-Insulator Substrate," filed Feb. 26, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and interconnect structures for the semiconductor devices. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1B-1F illustrate cross-sectional views of a semiconductor device with isolation structures, in accordance with some embodiments.

FIGS. 3-18 illustrate cross-sectional views of a semiconductor device with isolation structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
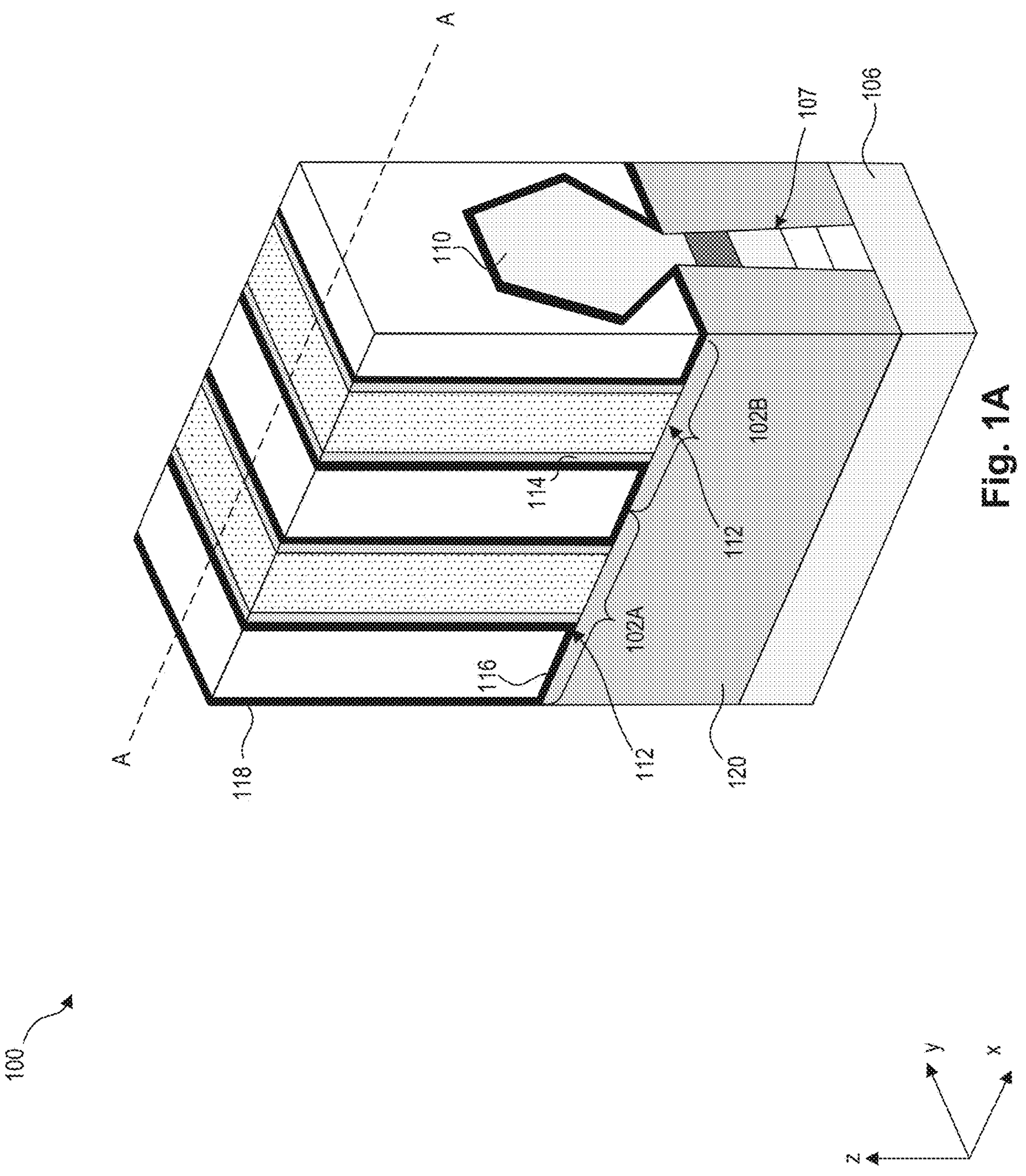
FIG. 1A illustrates an isometric view of a semiconductor device with isolation structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive" refers to an electrically conductive structure, layer, and/or region.

As used herein, the term "superlattice structure" defines a structure having a stack of nanostructured layers of two different materials that are arranged in an alternating configuration.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example methods of forming FETs (e.g., finFETs or GAA FETs) with superlattice structures on a substrate with an embedded isolation structure. The embedded isolation structures can electrically isolate the FETs from other devices formed on or electrically connected to the substrate. In some embodiments, the embedded isolation structure can be disposed between a semiconductor layer and a wafer or a carrier wafer of the substrate. The FETs with the superlattice structures can be formed on the semiconductor layer. Due to the high temperature fabrication process (e.g., at a temperature of about 600° C. to about 900° C.) of the superlattice structures, forming the superlattice structures without thermal damages (e.g., thermal agglomeration) to the microstructure of the semiconductor layer can be challenging.

The example methods disclosed herein can form the superlattice structures on the substrate without degrading the structural integrity of the semiconductor layer, consequently improving the device performance and reliability. In some embodiments, a method can include forming a stack with the superlattice structure formed on a sacrificial substrate and the substrate with the embedded isolation structure formed on the superlattice structure. The formation of the substrate can be followed by flipping the stack such that the superlattice structure is disposed on the substrate and the sacrificial substrate is disposed on the superlattice structure. The flipping of the stack can be followed by the removal of the sacrificial substrate by a wafer thin down process and the formation of the FETs on the superlattice structure. Thus, with the use of the example method, high temperature processing of the superlattice structure can be performed prior to the formation of the substrate and as a result, thermal damages to the semiconductor layer of the substrate can be prevented.

Figure 1C:
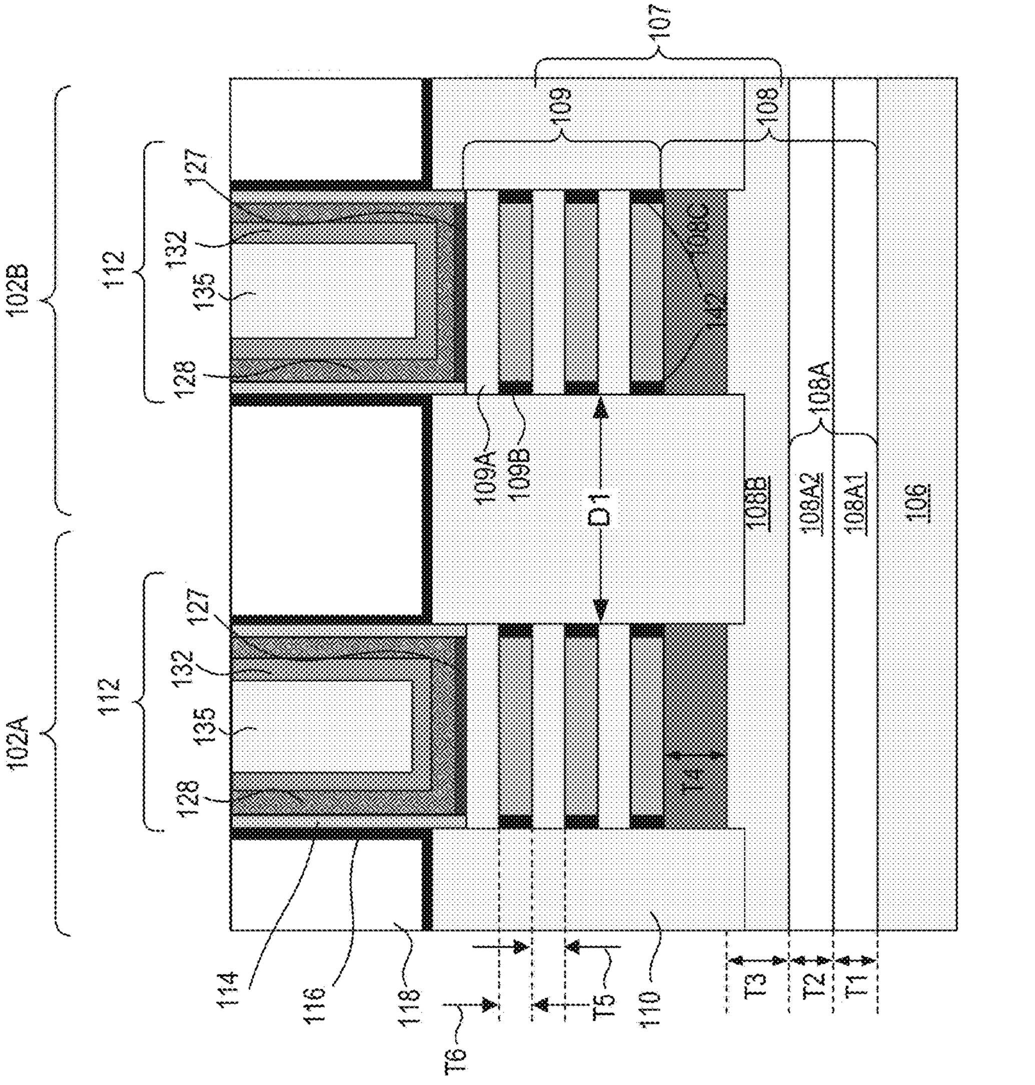

A semiconductor device 100 having FETs 102A-102B is described with reference to FIGS. 1A-1C, according to some embodiments. FIG. 1A illustrates an isometric view of semiconductor device 100, according to some embodiments. Semiconductor device 100 can have different cross-sectional views along line A-A of FIG. 1A as illustrated in FIGS. 1B-1F, according to various embodiments. The discussion of elements in FIGS. 1A-1F with the same annotations applies to each other, unless mentioned otherwise. Though two FETs are discussed with reference to FIGS. 1A-1F, semiconductor device 100 can have any number of FETs. FETs 102A-102B can be n-type, p-type, or a combination thereof. The discussion of elements of FETs 102A-102B with the same annotations applies to each other, unless mentioned otherwise.

Semiconductor device 100 can be formed on a substrate 106. Substrate 106 can be a semiconductor material, such as silicon, germanium (Ge), silicon germanium (SiGe), silicon carbide (SiC), gallium arsenide (GaAs), gallium phosphide (GaP), indium phosphide (InP), indium arsenide (InAs), silicon germanium carbide (SiGeC), and a combination thereof. Further, substrate 106 can be doped with p-type dopants (e.g., boron, indium, aluminum, or gallium) or n-type dopants (e.g., phosphorus or arsenic).

FETs 102A-102B can include a fin structure 107 extending along an X-axis, gate structures 112 extending along a Y-axis, epitaxial fin regions 110, and gate spacers 114. Though a single fin structure and two gate structures are discussed with reference to FIGS. 1A-1C, semiconductor device 100 can have any number of fin structures and gate structures. Fin structure 107 can include a base structure 108 and superlattice structures 109 disposed on base structure 108, as shown in FIG. 1B. Base structure 108 can include (i) a bi-layer isolation structure 108A disposed on substrate 106, (ii) a semiconductor layer 108B disposed on bi-layer isolation structure 108A, and (iii) a channel isolation layer 108C disposed on semiconductor layer 108B.

Bi-layer isolation structure 108A can be arranged to electrically isolate semiconductor device 100 from other devices (not shown) formed on or electrically connected to substrate 106 in an integrated circuit. Bi-layer isolation structure 108A can include a first dielectric layer 108A1 disposed on substrate 106 and a second dielectric layer 108A2 disposed on first dielectric layer 108A1. In some embodiments, first dielectric layer 108A1 can have a thickness T1 ranging from about 1 nm to about 20 nm and second dielectric layer 108A2 can have a thickness T2 ranging from about 3 nm to about 20 nm. If thicknesses T1 and T2 are less than about 1 nm and 3 nm, respectively, there may be current leakage between semiconductor device 100 and the other devices, which can negatively impact the performance and reliability of the integrated circuit. On the other hand, if thicknesses T1 and T2 are greater than about 20 nm, the process time (e.g., deposition and etching times) to form fin structure 107 increases, consequently increasing device manufacturing time and cost. In some embodiments, thicknesses T1-T2 can be equal to or different from each other.

In some embodiments, first dielectric layer 108A1 can include an oxide, nitride, or oxynitride of a material of substrate 106 (e.g., silicon oxide ($SiO_2$), silicon nitride (SiN), or silicon oxynitride (SiON)). In some embodiments, second dielectric layer 108A2 can include an oxide, nitride, or oxynitride of a material of semiconductor layer 108B (e.g., $SiO_2$, SiN, or SiON). Semiconductor layer 108B can include Si, Ge, or SiGe and can have a polycrystalline or a single crystalline structure. In some embodiments, semiconductor layer 108B can include a material similar to or different from the material of substrate 106.

Channel isolation layer 108C can be arranged to electrically isolate superlattice structures 109 from each other and prevent current leakage between superlattice structures 109, which act as nanostructured channel regions 109 of FETs 102A-102B. Channel isolation layer 108C can be used to prevent current leakage through semiconductor layer 108B when nanostructured channel regions 109 are spaced apart from each other by a distance D1 of about 5 nm to about 30 nm. In addition, channel isolation layer 108C can serve as an anti-punch through layer to prevent and/or reduce subthreshold leakage between epitaxial regions 110 that can be source/drain (S/D) regions 110 and reduce drain-induced barrier lowering. As a result, the formation of an anti-punch through layer though ion implantation can be avoided by the use of channel isolation layer 108C, and consequently, ion-implantation process-related damages (e.g., surface damages from ion impingement) to semiconductor layer 108B can be prevented.

In some embodiments, channel isolation layer 108C can have a thickness T4 ranging from about 5 nm to about 30 nm for effective electrical isolation between nanostructured channel regions 109. If thickness T4 is less than about 5 nm, device performance and reliability of FETs 102A-102B may be degraded due to current leakage between nanostructured channel regions 109. On the other hand, if thickness T4 is greater than about 30 nm, the process time (e.g., deposition and etching times) to form fin structure 107 increases, consequently increasing device manufacturing time and cost. In some embodiments, portions of channel isolation layer 108C under epitaxial fin regions 110 can be recessed within STI region 120 (shown in FIG. 1A) compared to portions of channel isolation layer 108C under gate structures 112 (shown in FIG. 1B) as a result of an etching process used in the formation of epitaxial fin regions 110 described in further detail below.

Channel isolation layer 108C can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$); (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu); or (iii) a combination thereof.

In some embodiments, channel isolation layer 108C may not be interposed between superlattice structures 109 and semiconductor layer 108B. Instead, superlattice structures 109 can be disposed directly on semiconductor layer 108B when nanostructured channel regions 109 are spaced apart from each other by a distance D1 greater than about 30 nm. In the absence of channel isolation layer 108C, semiconductor layer 108B can include n-well regions and/or p-well regions for FETs 102A-102B, according to some embodiments. In some embodiments, semiconductor layer 108B can have a thickness T3 ranging from about 3 nm to about 10 nm.

Superlattice structures 109 can include nanostructured layers 109A-109B stacked in an alternating configuration. Each of nanostructured layers 109A-109B can be nanostructured channel regions 109A-109B of FETs 102A-102B. Though each superlattice structure 109 is shown to have three pairs of nanostructured layers 109A-109B, each superlattice structure 109 can have one or more pairs of nanostructured layers 109A-109B.

Nanostructured layers 109A-109B can include (i) semiconductor materials different from each other, (ii) semiconductor materials with etch selectivity different from each other, (iii) semiconductor materials with lattice constants different from each other, and/or (iv) semiconductor materials similar to or different from substrate 106. Nanostructured layers 109A-109B can include (i) an elementary semiconductor, such as Si or Ge; (ii) a compound semiconductor including a III-V semiconductor material; (iii) an alloy semiconductor including SiGe, germanium stannum, or silicon germanium stannum; or (iv) a combination thereof. In some embodiments, one of nanostructured layers 109A-109B can have a strained SiGe material with a Ge concentration ranging from about 5 atomic % to about 35 atomic %. The Ge concentration within this range of about 5 atomic % to about 35 atomic % induces an adequate level of strain within the SiGe lattice structure to achieve a high charge carrier mobility within nanostructured channel regions 109A or 109B for high-performance FETs 102A-102B. In some embodiments, nanostructured layers 109A-109B can have thicknesses or diameters T5-T6 ranging from about 1 nm to about 8 nm.

Epitaxial fin regions 110 can be source/drain (S/D) regions 110 of FETs 102A-102B and can include an epitaxially-grown semiconductor material. In some embodiments, the epitaxially-grown semiconductor material can include the same material or a different material from the material of semiconductor layer 108B and/or nanostructured layers 109A-109B. Epitaxial fin regions 110 can be n- or p-type. In some embodiments, n-type epitaxial fin regions 110 can include SiAs, SiC, or SiCP and p-type epitaxial fin regions 110 can include SiGe, SiGeB, GeB, SiGeSnB, or a III-V semiconductor compound.

Epitaxial fin regions 110 are epitaxially grown on sidewalls of nanostructured layers 109A-109B when portions of channel isolation layer 108C that are not underlying superlattice structures 109 are present on semiconductor layer 108B, as shown in FIG. 1B. On the other hand, epitaxial fin regions 110 can be epitaxially grown on semiconductor layer 108B and/or sidewalls of nanostructured layers 109A-109B when the portions of channel isolation layer 108C that are not underlying superlattice structures 109 are removed from semiconductor layer 108B as shown in FIG. 1C or when channel isolation layer 108C is not formed (not shown) in semiconductor device 100.

Gate structures 112 can be multi-layered structures and can be disposed on superlattice structures 109, as shown in FIGS. 1B-1C. Gate structures 112 can include interfacial oxide (10) layers 127, high-k (HK) gate dielectric layers 128, work function metal (WFM) layers 132, and gate metal fill layers 135. 10 layers 127 can include silicon oxide ($SiO_2$), silicon germanium oxide ($SiGeO_x$), or germanium oxide ($GeO_x$) and a thickness ranging from about 0.5 nm to about 1.5 nm. HK gate dielectric layers 128 can have a thickness (e.g., about 1 nm to about 3 nm) that is about 2 to 3 times the thickness of IO layers 127 and can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layers 132 can include titanium aluminum (TiAl), titanium aluminum carbide (TiAlC), tantalum aluminum (TaAl), tantalum aluminum carbide (TaAlC), or a combination thereof. Gate metal fill layers 135 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. Gate spacers 114 can form sidewalls of gate structures 112. Each of gate spacers 114 can include insulating material, such as silicon oxide, silicon nitride, silicon oxynitride, a low-k material, and a combination thereof.

Figure 1D:
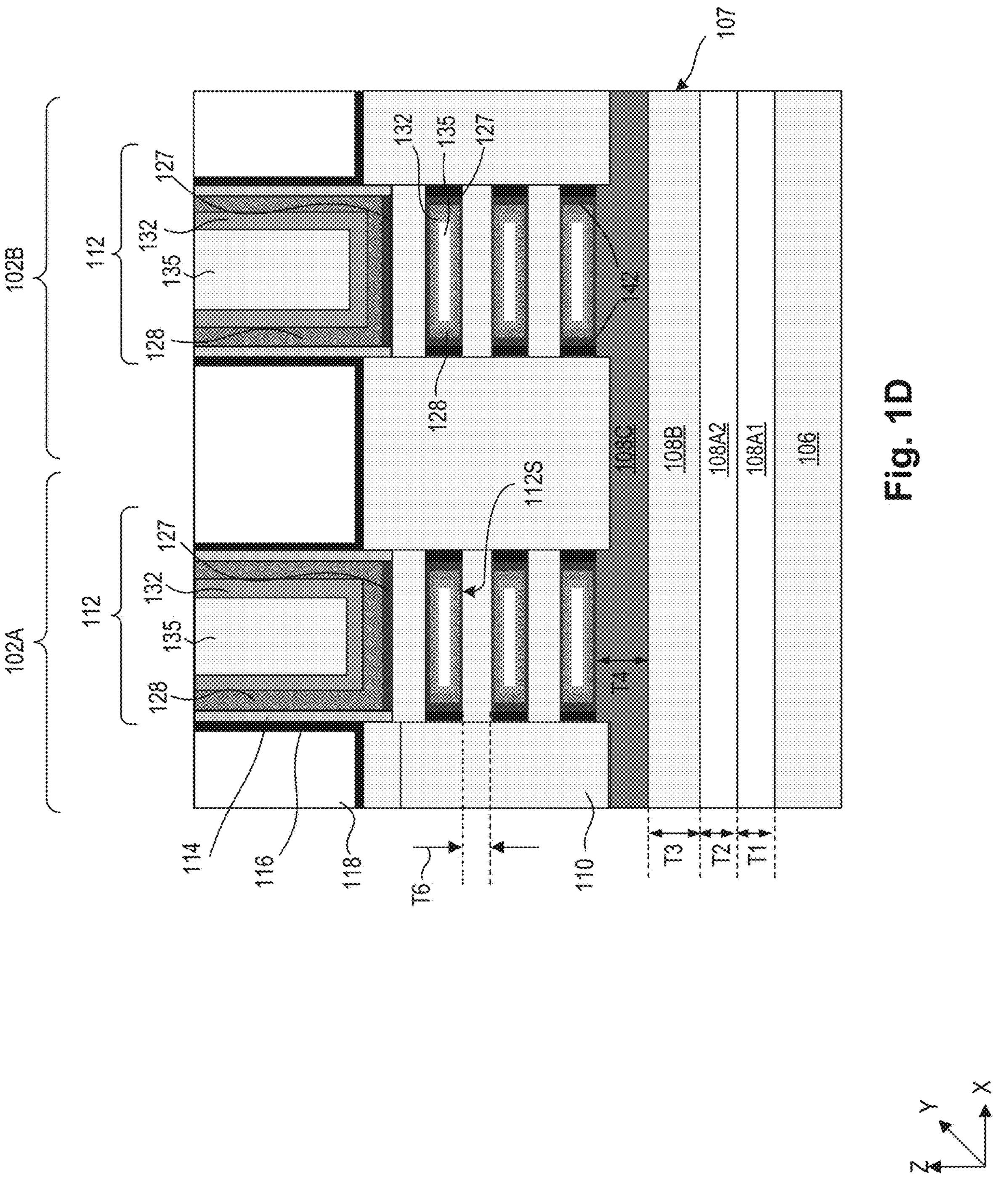

In some embodiments, multi-layered structures gate structures 112 can be wrapped around nanostructured channel regions 109A in addition to being disposed on superlattice structures 109, as shown in FIG. 1D. Such gate structures 112 can be referred to as "gate-all-around (GAA) structures 112" or "horizontal GAA structures 112" and FETs 102A-102B with GAA structures 112 can be referred to as "GAA FETs 102A-102B." To form GAA structures 112, nanostructured channel regions 109B are replaced by one or more layers of GAA structures 112 and inner spacers 142, which are described in further detail below. Though FIG. 1D shows that all the layers of gate structure 112 are wrapped around each of nanostructured channel regions 109A, each of nanostructured channel regions 109A can be wrapped around by at least IO layers 127 and HK gate dielectric layers 128 to fill the spaces between adjacent nanostructured channel regions 109A. As such, nanostructured channel regions 109A can be electrically isolated from each other to prevent shorting between GAA structures 112 and S/D regions 110 during operation of FETs 102A-102B. Inner spacers 142 can form sidewalls of gate sections 112S and electrically isolate gate sections 112S from adjacent S/D regions 110. Each of inner spacer 142 can include insulating material, such as silicon oxide, silicon nitride, silicon oxynitride, a low-k material, and a combination thereof.

Figure 1E:
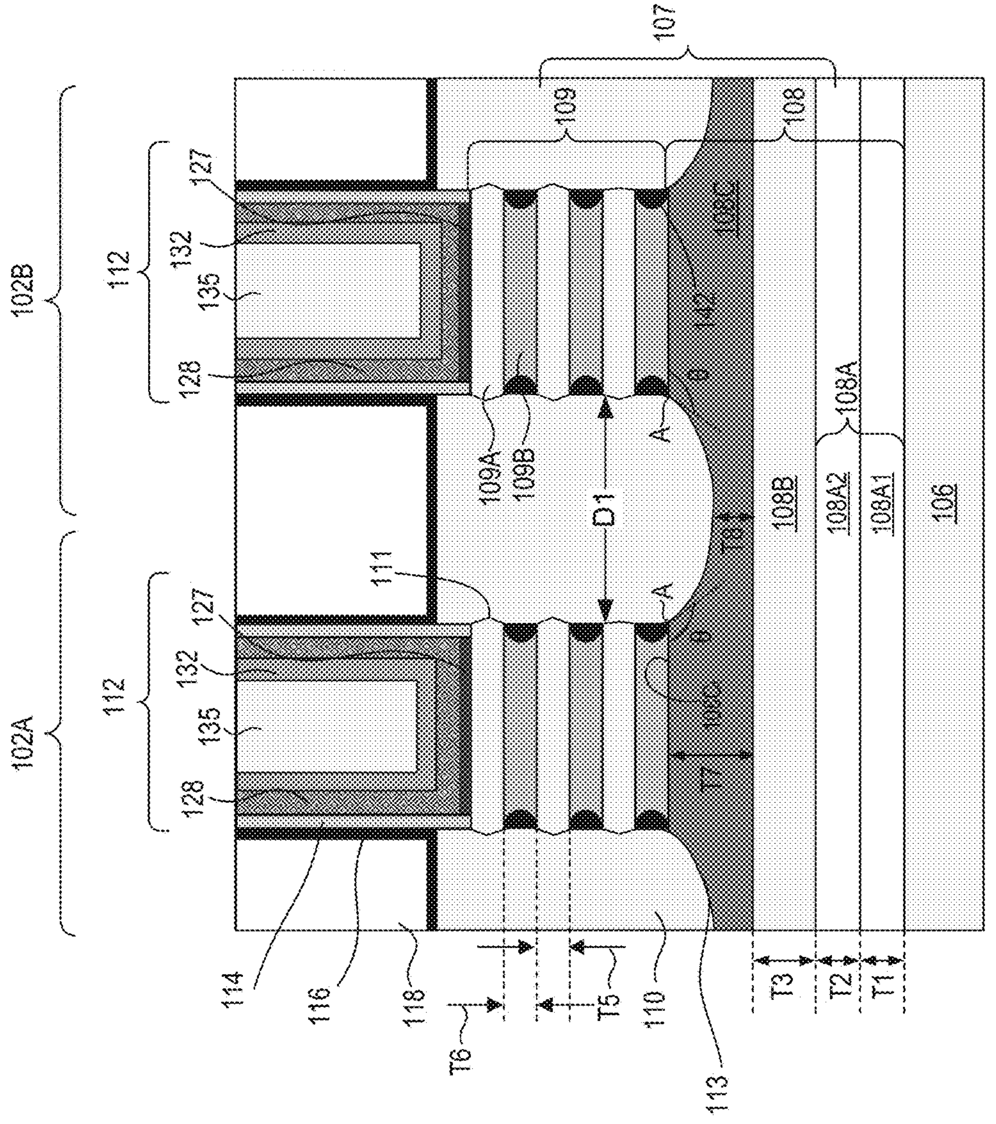
Figure 1E:
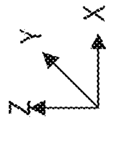

In some embodiments, interfaces 111 between epitaxial fin regions 110 and nanostructures channel regions 109A can be non-linear and have angled facets, as shown in FIG. 1E, instead of the linear interfaces shown in FIGS. 1B and 1D. In some embodiments, FETs 102A-102B can have non-linear interfaces 113 between epitaxial fin regions 110 and channel isolation layer 108C, as shown in FIG. 1E, instead of the linear interfaces shown in FIGS. 1B and 1D. The non-linear interfaces 113 can be a result of controlled etching channel isolation layer 108C prior to the formation of epitaxial fin regions 110, as described in further detail with reference FIG. 11. In some embodiments, the non-linear (e.g., curved) interface 113 can be formed to have a larger surface area on the back side surfaces of epitaxial regions 110 for the formation of back S/D contact structures, described below with reference to FIG. 1F. In some embodiments, based on the desired surface area on the back side surface of the epitaxial regions 110, the etching of channel isolation layer 108C can be controlled to tune the profiles of non-linear interfaces 113. The profiles can be tuned to have angles A ranging from about 120 degrees to about 150 degrees between top surfaces 108$C_t$ of channel isolation layer 108C and tangent lines at corners A of non-linear interface 113.

In some embodiments, the portions of channel isolation layer 108C under nanostructured channel regions 109 can be formed to have a thickness T7 ranging from about 5 nm to about 30 nm for effective electrical isolation between nanostructured channel regions 109 of FETs 102A-102B. If thickness T7 is less than about 5 nm, device performance and reliability of FETs 102A-102B may be degraded due to current leakage between nanostructured channel regions 109. On the other hand, if thickness T7 is greater than about 30 nm, the process time (e.g., deposition and etching times) to form fin structure 107 increases, consequently increasing device manufacturing time and cost. In some embodiments, the portions of channel isolation layer 108C under epitaxial fin regions 110 can be formed to have thicknesses smaller than thickness T7, with the smallest thickness T8 ranging from about 1 nm to about 10 nm. For effective electrical isolation between nanostructured channel regions 109 of FETs 102A-102B, the ratio between thickness T7 and T8 can range from about 5:1 to about 10:1.

Figure 1F:
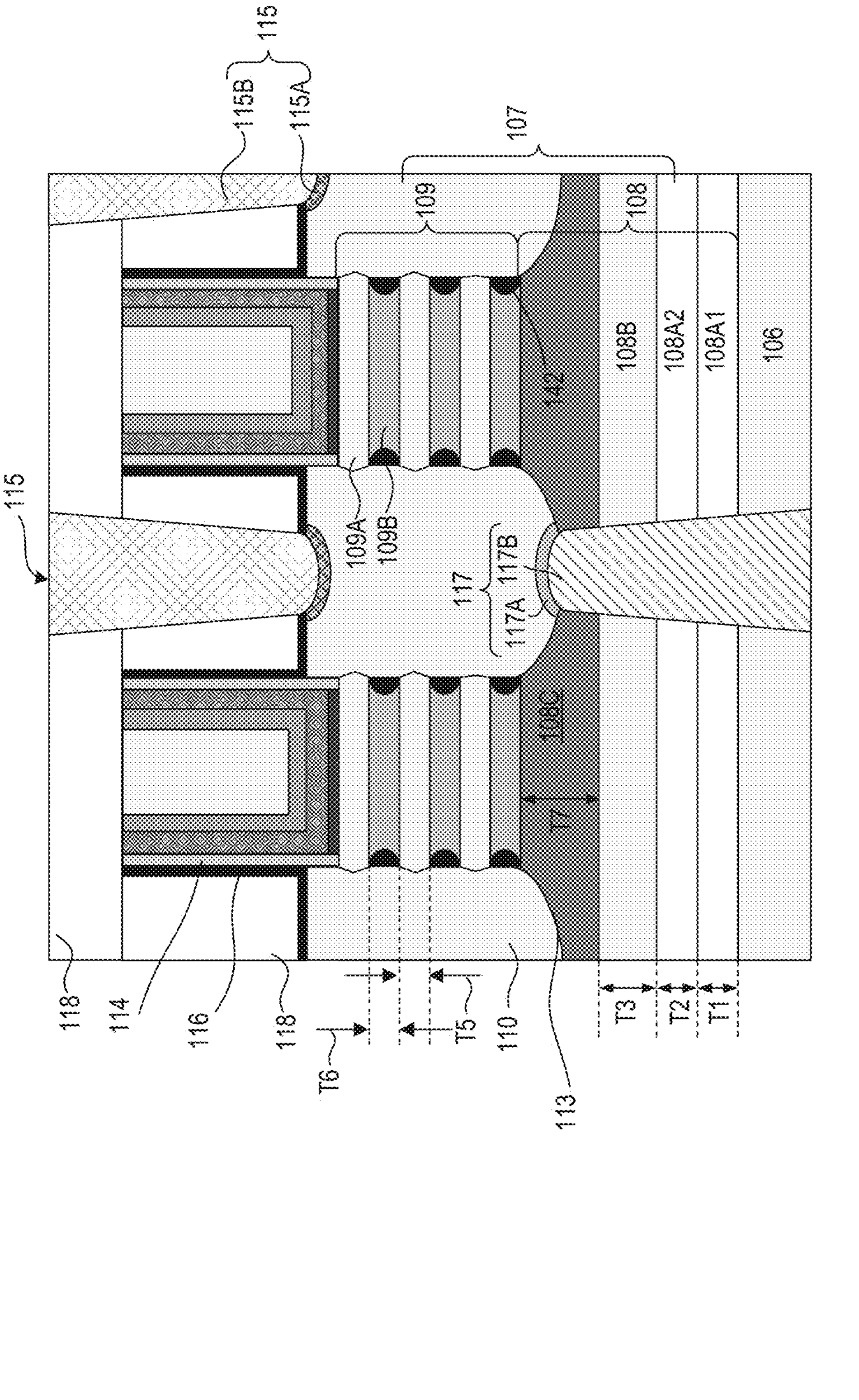

In some embodiments, semiconductor device 100 can include front and back S/D contact structures 115 and 117, respectively, as shown in FIG. 1F. Front S/D contact structures 115 can be formed on front side surface of epitaxial structures 110 and back S/D contact structure 117 can be formed on back side surface of epitaxial structures 110. Though front S/D contact structure 115 is shown in on two epitaxial structures 110, front S/D contact structure 115 can be formed on front side surfaces of one or more of epitaxial structures 110. Similarly, though back S/D contact structure 117 is shown in on one epitaxial structure 110, back S/D contact structure 117 can be formed on back side surfaces of one or more of epitaxial structures 110. Front and back S/D contact structures 115 and 117 can be used to connect epitaxial structures to other elements of semiconductor device and/or power supplies. Front S/D contact structures 115 can include silicide layers 115A and contact plugs 115B. Similarly, back S/D contact structures 117 can include silicide layers 117A and contact plugs 117B. In some embodiments, silicide layers 115A and 117A can include metal silicides similar to or different from each other. In some embodiments, contact plugs 115B and 117B can include conductive materials similar to or different from each other.

Semiconductor device 100 can further include etch stop layer (ESL) 116, interlayer dielectric (ILD) layer 118, and shallow trench isolation (STI) regions 120. ESL 116 can include an insulating material, such as silicon oxide and silicon germanium oxide. ILD layer 118 can be disposed on ESL 116 and can include a dielectric material. STI regions 120 can include an insulating material and can provide electrical isolation between FETs 102A-102B in addition to channel isolation layer 108C. The cross-sectional shapes of semiconductor device 100 and its elements (e.g., fin structure 107, gate structures 112, epitaxial fin regions 110, inner spacers 142, gate spacers 114, and/or STI regions 120) are illustrative and are not intended to be limiting.

Figure 2:
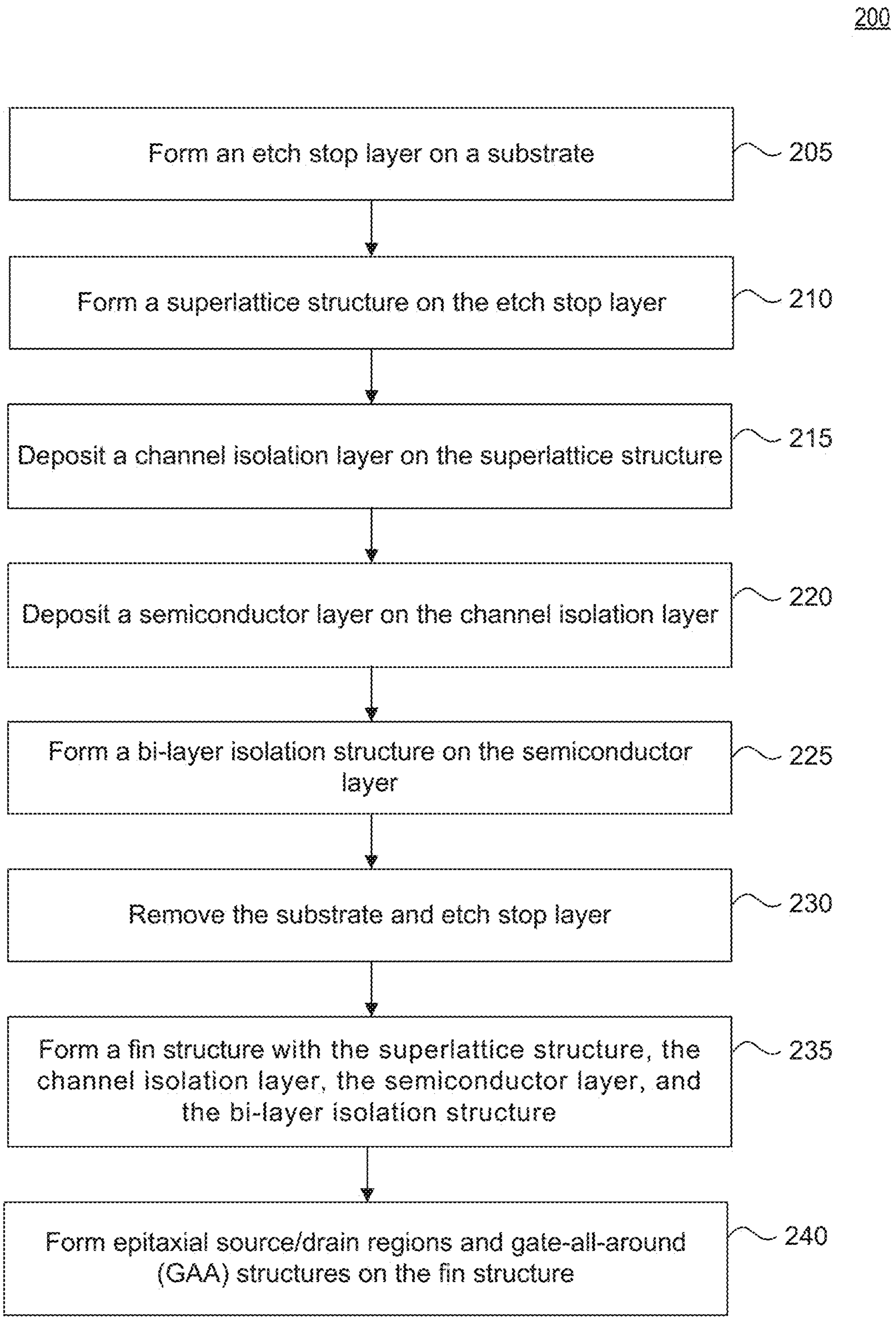
FIG. 2 is a flow diagram of a method for fabricating a semiconductor device with isolation structures, in accordance with some embodiments.

FIG. 2 is a flow diagram of an example method 200 for fabricating semiconductor device 100 with the cross-sectional view shown in FIG. 1D, according to some embodiments. For illustrative purposes, the operations illustrated in FIG. 2 will be described with reference to FIGS. 3-18. FIGS. 3-10 are isometric views and FIGS. 11-18 are cross-sectional views along line A-A of FIG. 1A at various stages of fabricating semiconductor device 100, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3-18 with the same annotations as elements in FIGS. 1A-1D are described above.

Figure 3:
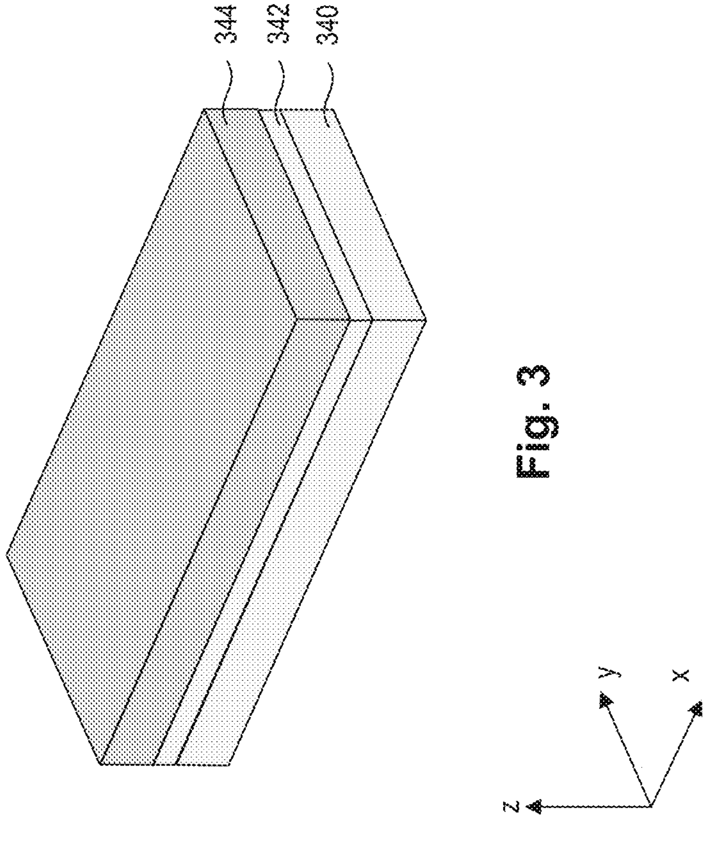

In operation 205, an etch stop layer is formed on a substrate. For example, as shown in FIG. 3, an etch stop layer 344 is formed on substrate 340. Etch stop layer 344 is arranged to prevent overlying layers (e.g., nanostructured layer 109B) from being etched during the subsequent removal (e.g., thin down process) of substrate 340, which is described in further detail below. In some embodiments, the process for forming etch stop layer 344 can include sequential operations of (i) depositing a seed layer 342 on substrate 340, as shown in FIG. 3, and (ii) epitaxially growing etch stop layer 344 on seed layer 342, as shown in FIG. 3. Seed layer 342 is deposited prior to the epitaxial growth of etch stop layer 344 to control the crystal growth of etch stop layer 344. The crystal growth control through seed layer 342 prevents or reduces the formation of defects in etch stop layer 344, promoting the epitaxial growth of a high quality etch stop layer 344 on substrate 340. The higher the quality of etch stop layer 344, the lower is the etch rate of etch stop layer 344 in slurries and/or etchants (e.g., tetramethylammonium hydroxide (TMAH)) used in the subsequent removal of substrate 340. Thus, with the use of seed layer 342, etch stop layer 344 with a higher etch-resistance is achieved compared to etch stop layers formed without an underlying seed layer.

In some embodiments, the deposition of seed layer 342 can include depositing a semiconductor layer (e.g., Si, Ge, or SiGe) with a thickness of about 0.5 nm to about 1 nm on substrate 340. The deposition of the semiconductor layer can include using a precursor, such as silane ($SiH_4$), disilane ($Si_2H_6$), germane ($GeH_4$), digermane ($Ge_2H_6$), and dichlorosilane ($SiH_2Cl_2$), at a temperature of about 700° C. to about 950° C., and under a pressure of about 10 torr to about 50 torr. In some embodiments, the epitaxial growth of etch stop layer 344 can include epitaxially growing a doped semiconductor layer (e.g., boron-doped SiGe) with (i) a thickness of about 10 nm to about 30 nm, (ii) with a Ge concentration of about 15 atomic % to about 35 atomic %, and (iii) a boron dopant concentration of about $5\times10^{19}$ $cm^{-3}$ to about $5\times10^{21}$ $cm^{-3}$. Epitaxially growing the doped semiconductor layer with a thickness, a Ge concentration, and/or a boron dopant concentration outside these ranges increases the etch rate of etch stop layer 344, consequently degrading the device manufacturing process reliability. In some embodiments, the epitaxial growth of the doped semiconductor layer can include using a precursor, such as germane ($GeH_4$), dichlorosilane ($SiH_2Cl_2$), and diborane ($B_2H_6$), at a temperature of about 600° C. to about 800° C., and under a pressure of about 10 torr to about 50 torr.

Figure 4:
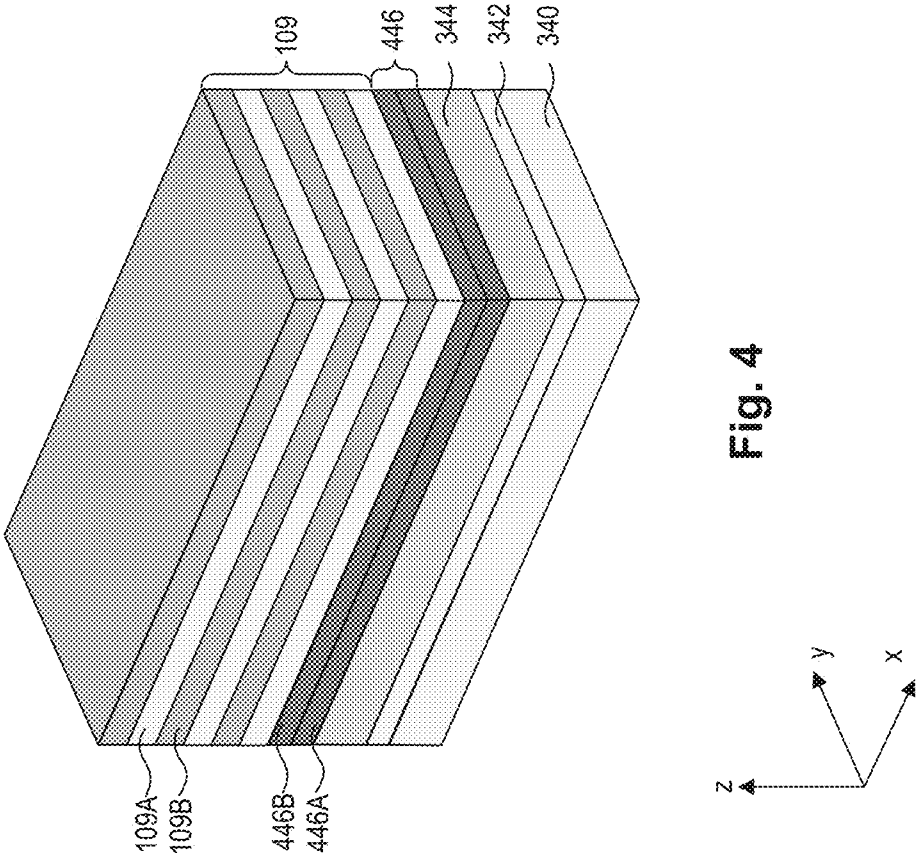

Referring to FIG. 2, in operation 210, a superlattice structure is formed on the etch stop layer. For example, as shown in FIG. 4, superlattice structure 109 is formed on etch stop layer 344. The formation of superlattice structure 109 can include sequential operations of (i) depositing a seed layer 446 on etch stop layer 344, as shown in FIG. 4, and (ii) epitaxially growing superlattice structure 109 on seed layer 446, as shown in FIG. 4. In some embodiments, seed layer 446 can act as a barrier layer between etch stop layer 344 and superlattice structure 109 to prevent the diffusion of dopants (e.g., boron dopants) from etch stop layer 344 to superlattice structure 109. Further, seed layer 446 can act as a nucleation layer to control the crystal growth and orientation of nanostructured layers 109A-109B of superlattice structure 109. The crystal growth and orientation control through seed layer 446 prevents or reduces the formation of defects in nanostructured layers 109A-109B, which subsequently form nanostructures channel regions 109A-109B. The presence of defects in nanostructured layers 109A-109B as a result of the dopant diffusion and/or the growth process can lower the charge carrier mobility in nanostructured layers 109A-109B, which in turn can degrade the device performance. Thus, the use of seed layer 446 results in a higher quality superlattice structure 109 compared to superlattice structures formed without an underlying seed layer.

In some embodiments, seed layer 446 can include a first layer 446A disposed on etch stop layer 344 and a second layer 446B disposed on first layer 446A. The deposition of seed layer 446 can include (i) depositing a Si or SiGe layer with a thickness of about 1 nm to about 5 nm on etch stop layer 344 to form first layer 446A, and (ii) depositing a silicon carbide layer with a carbon concentration of about 0.1 atomic % to about 5 atomic % and a thickness of about 2 nm to about 6 nm on first layer 446A to form second layer 446B. The deposition of the silicon carbide layer can include using a precursor, such as dichlorosilane ($SiH_2Cl_2$) and monomethyl silane ($CH_3SiH_3$), at a temperature of about 500° C. to about 700° C., and under a pressure of about 10 torr to about 50 torr.

In some embodiments, epitaxially growing superlattice structure 109 can include epitaxially growing nanostructured layer 109A-109B in an alternating configuration on seed layer 446 using precursors, such as silane ($SiH_4$), disilane ($Si_2H_6$), germane ($GeH_4$), and dichlorosilane ($SiH_2Cl_2$), at a temperature of about 450° C. to about 600° C., and under a pressure of about 10 torr to about 50 torr. Further, epitaxially growing superlattice structure 109 can include epitaxially growing each of nanostructured layers 109A-109B with a thickness of about 2 nm to about 8 nm. In some embodiments, nanostructured layers 109A can include Si without any substantial amount of Ge (e.g., with no Ge) and nanostructured layers 109B can include SiGe with a Ge concentration of about 5 atomic % to about 35 atomic %.

Figure 5:
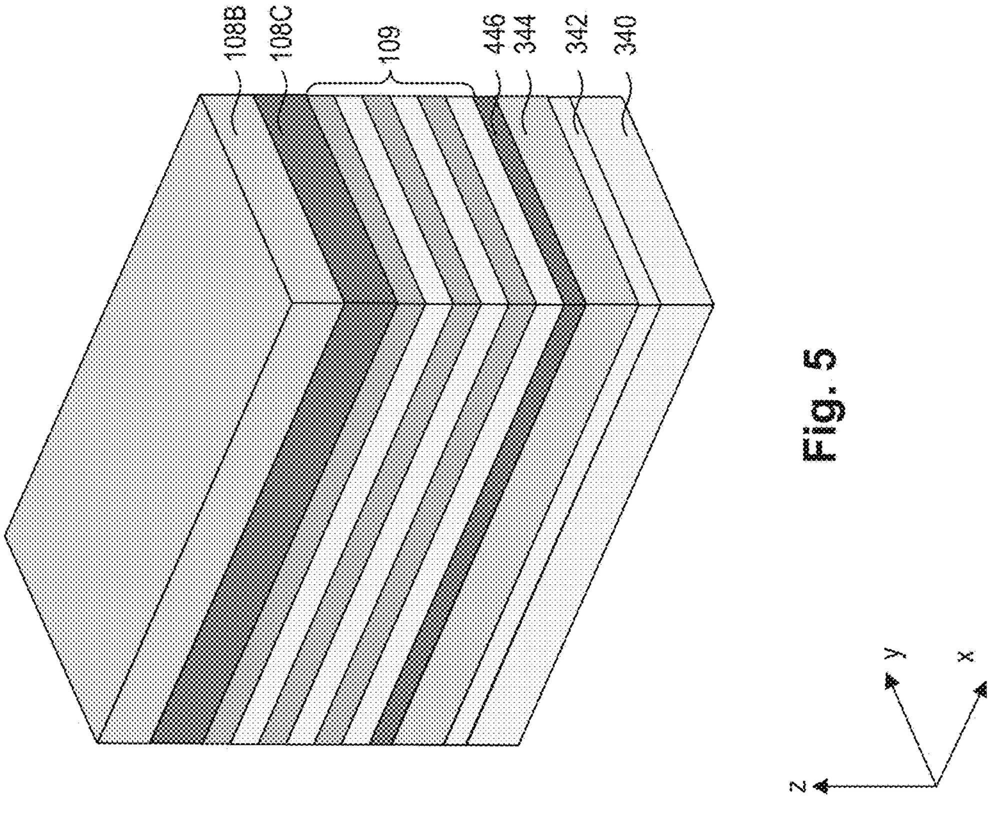

Referring to FIG. 2, in operation 215, a channel isolation layer is deposited on the superlattice structure. For example, as shown in FIG. 5, channel isolation layer 108C is deposited on superlattice structure 109. In some embodiments, the deposition of channel isolation layer 108C can include depositing a high-k dielectric layer with a thickness of about 5 nm to about 30 nm using a chemical vapor deposition (CVD) process.

Referring to FIG. 2, in operation 220, a semiconductor layer is deposited on the channel isolation layer. For example, as shown in FIG. 5, semiconductor layer 108B is deposited on channel isolation layer 108C. In some embodiments, the deposition of semiconductor layer 108B can include depositing a polycrystalline or a monocrystalline layer of Si, Ge, SiGe, or a suitable semiconductor material with a thickness of about 3 nm to about 10 nm using a CVD process or a spin-coating process. In some embodiments, operation 220 can follow operation 210 instead of following operation 215 and semiconductor layer 108B can be epitaxially grown on superlattice structure 109.

Figure 6:
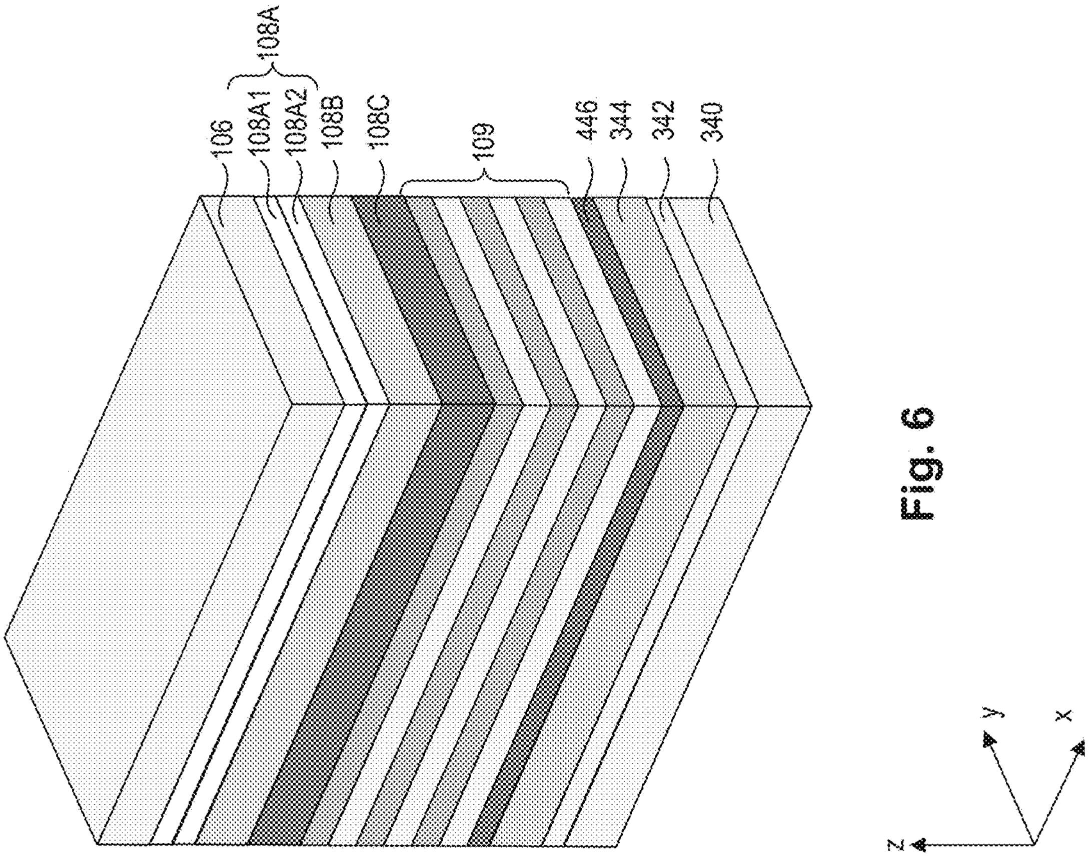

Referring to FIG. 2, in operation 225, a bi-layer isolation structure is formed on the semiconductor layer. For example, as shown in FIG. 6, bi-layer isolation structure 108A is formed on semiconductor layer 108B. The formation of bi-layer isolation structure 108A can include sequential operations of (i) forming second dielectric layer 108A2 on semiconductor layer 108B, as shown in FIG. 6, (ii) forming first dielectric layer 108A1 on substrate 106 (also can be a "carrier substrate 106"), as shown in FIG. 6, and (iii) bonding first and second dielectric layers 108A1-108A2 to each other using an oxide-oxide thermos-compression direct bonding process.

In some embodiments, the formation of second dielectric layer 108A2 can include forming a thermal oxide layer with a thickness of about 3 nm to about 20 nm on semiconductor layer 108B by annealing the structure of FIG. 5 at a temperature of about 600° C. to about 800° C. in an oxygen ambient or in a steam and oxygen ambient. During the annealing process (also referred to as "thermal oxidation process"), a top portion of semiconductor layer 108B is oxidized to form the thermal oxide layer of second dielectric layer 108A2. In some embodiments, instead of forming the thermal oxide layer, the formation of second dielectric layer 108A2 can include depositing a chemical oxide layer with a thickness of about 3 nm to about 20 nm on semiconductor layer 108B using a precursor, such as tetraethylorthosilicate (TEOS), in a CVD process at a temperature of about 650° C. to about 750° C. The formation of second dielectric layer 108A2 and the operations 205-220 can be performed in-situ in the same processing chamber without breaking vacuum of the processing chamber.

In some embodiments, the formation of first dielectric layer 108A1 can be performed ex-situ in a different processing chamber and can include forming a thermal oxide layer with a thickness of about 1 nm to about 20 nm on substrate 106 by annealing substrate 106 at a temperature of about 600° C. to about 800° C. in an oxygen ambient or in a steam and oxygen ambient. In some embodiments, instead of forming the thermal oxide layer, the formation of first dielectric layer 108A1 can include depositing a chemical oxide with a thickness of about 1 nm to about 20 nm on substrate 106 using a precursor, such as tetraethylorthosilicate (TEOS), in a CVD process at a temperature of about 650° C. to about 750° C.

Figure 7:
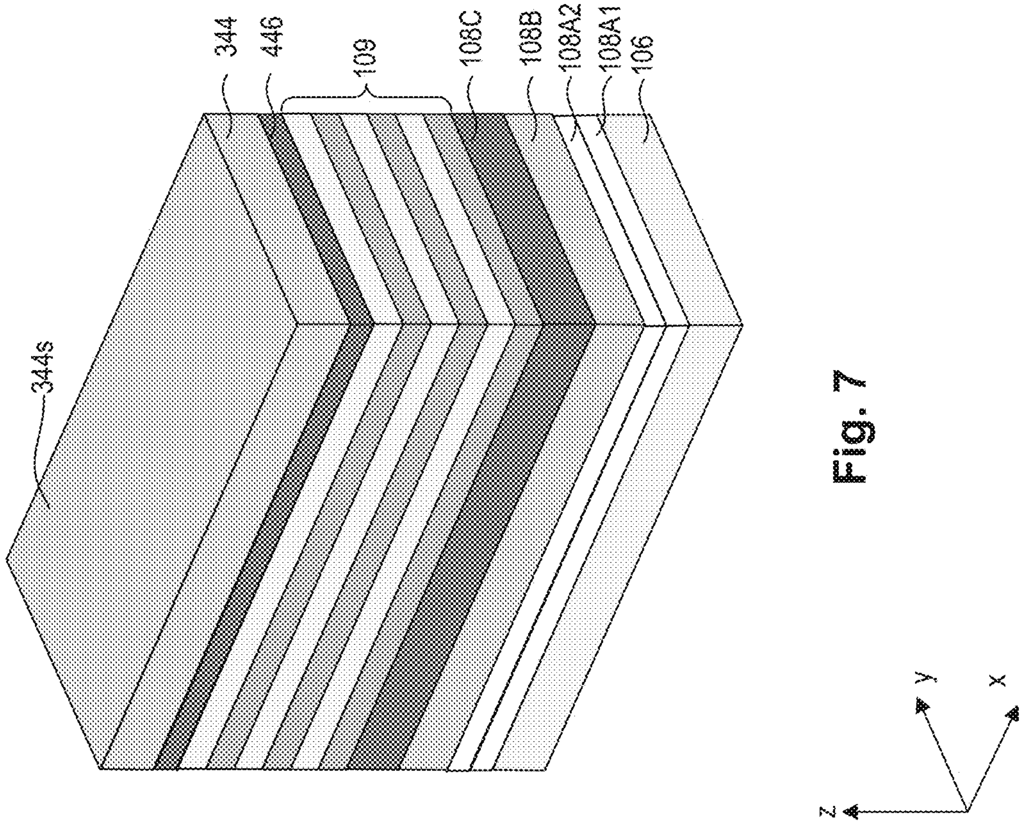
Figure 8:
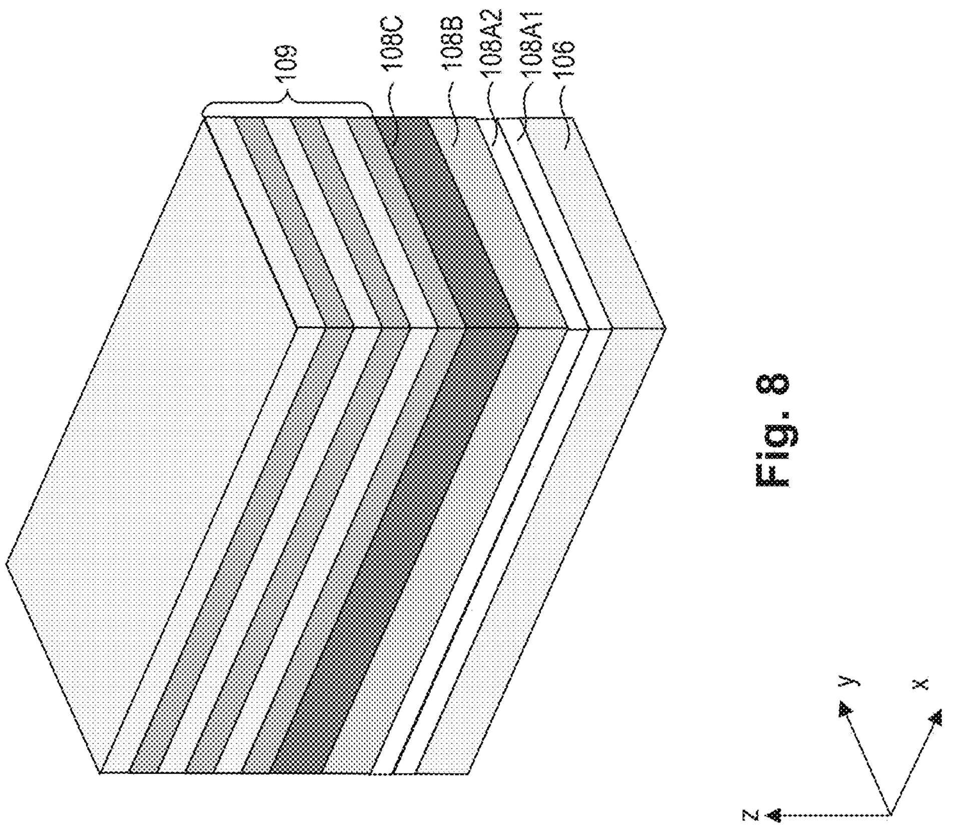

Referring to FIG. 2, in operation 230, the substrate and the etch stop layer are removed. For example, as shown in FIG. 8, substrate 340 and etch stop layer 344 are removed from the structure of FIG. 6. In some embodiments, substrate 340 and seed layer 342 can be removed by a thin down process (shown in FIG. 7), which can be followed by the removal of etch stop layer 344 and seed layer 446 by an etching process. The thin down process can include sequential operations of (i) performing a mechanical grinding process on substrate 340 of the structure of FIG. 6 to thin down substrate 340 to a thickness of about 20 μm to about 26 μm, (ii) performing a dry etching process on substrate 340 to further thin it down to a thickness of about 7 μm to about 10 μm, (iii) performing a chemical mechanical polishing (CMP) process on substrate 340 to further thin it down to a thickness of about 2 μm to about 3 μm, and (iv) performing a wet etching process using an etchant, such as TMAH to remove the polished substrate 340 and seed layer 342 and expose surface 344*s* of etch stop layer 344, as shown in FIG. 7. The removal of etch stop layer 344 and seed layer 446 can include performing a wet etching process on the structure of FIG. 7 to form the structure of FIG. 8.

Figure 9:
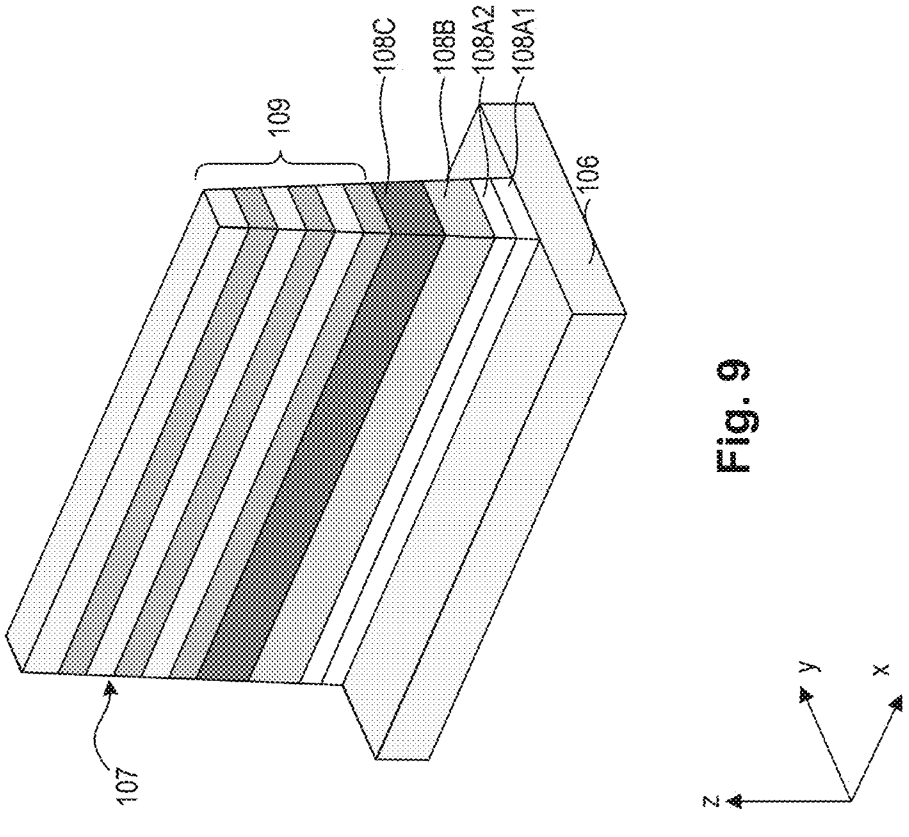

Referring to FIG. 2, in operation 235, a fin structure is formed with the superlattice structure, the channel isolation layer, the semiconductor layer, and the bi-layer isolation structure. For example, as shown in FIG. 9, fin structure 107 is formed on substrate 106. The formation of fin structure 107 can include sequential operations of (i) forming a patterned hard mask layer (not shown) on the structure of FIG. 8, and (ii) etching the portions of superlattice structure 109, channel isolation layer 108C, semiconductor layer 108B, and bi-layer isolation structure 108A in the structure of FIG. 8 that are not covered by the patterned hard mask layer. The etching process can include a dry etch, a wet etch process, or a combination thereof. The dry etch process can include using etchants having a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

Figure 10:
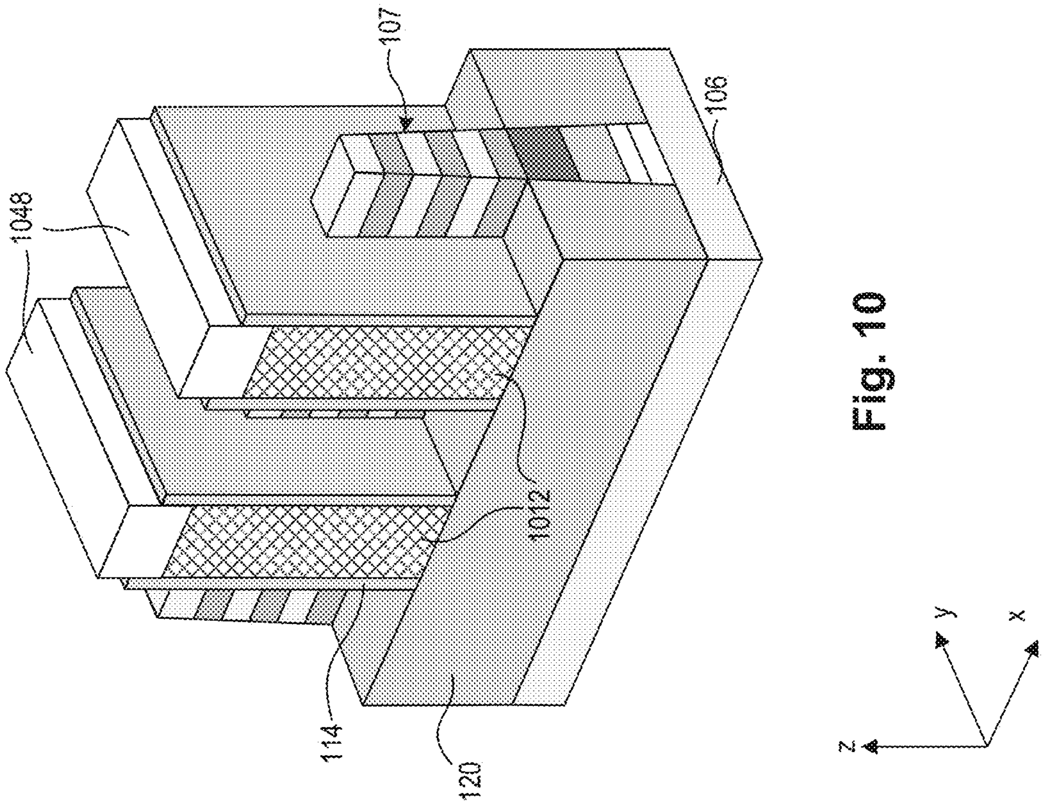
Figure 11:
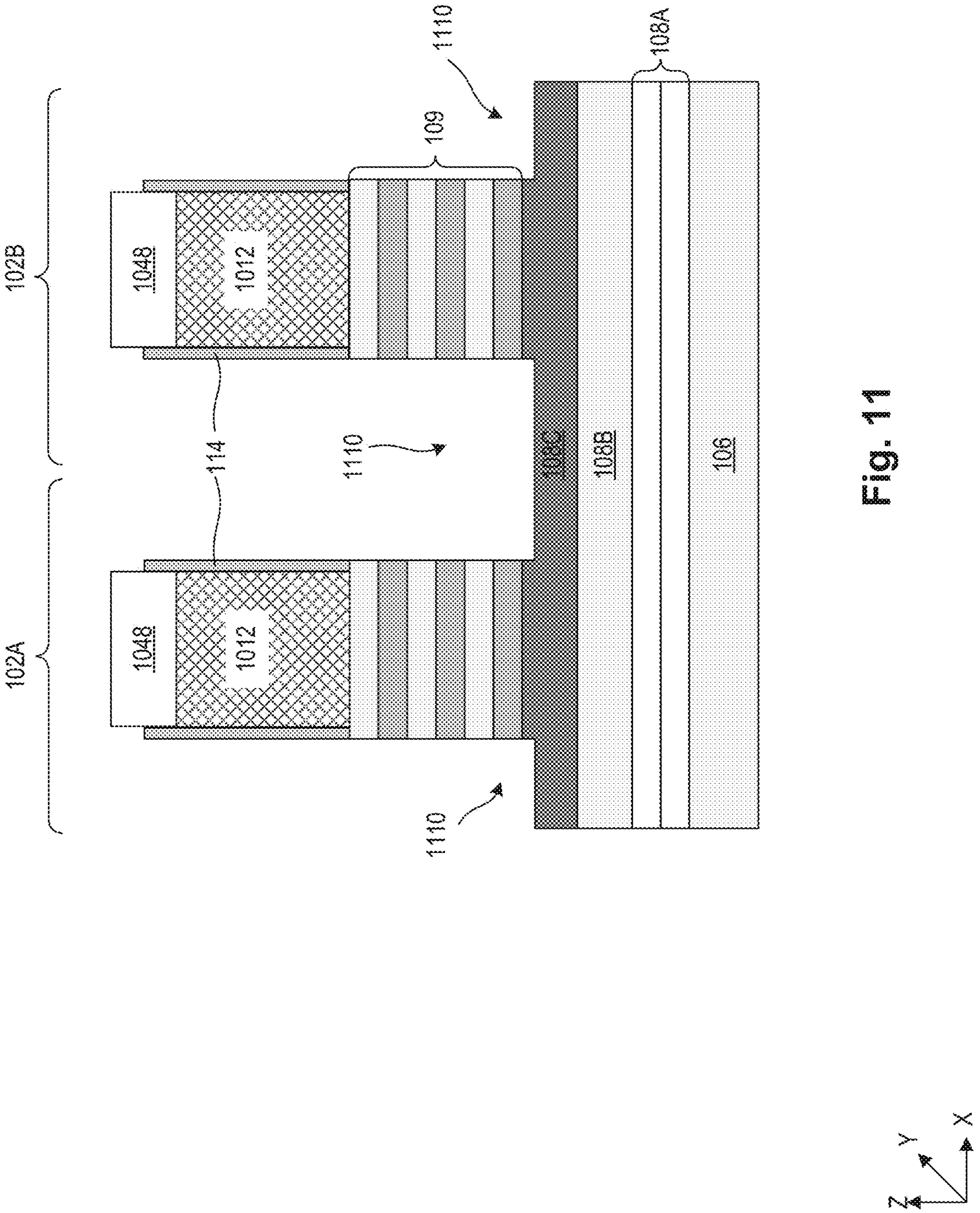
Figure 13:
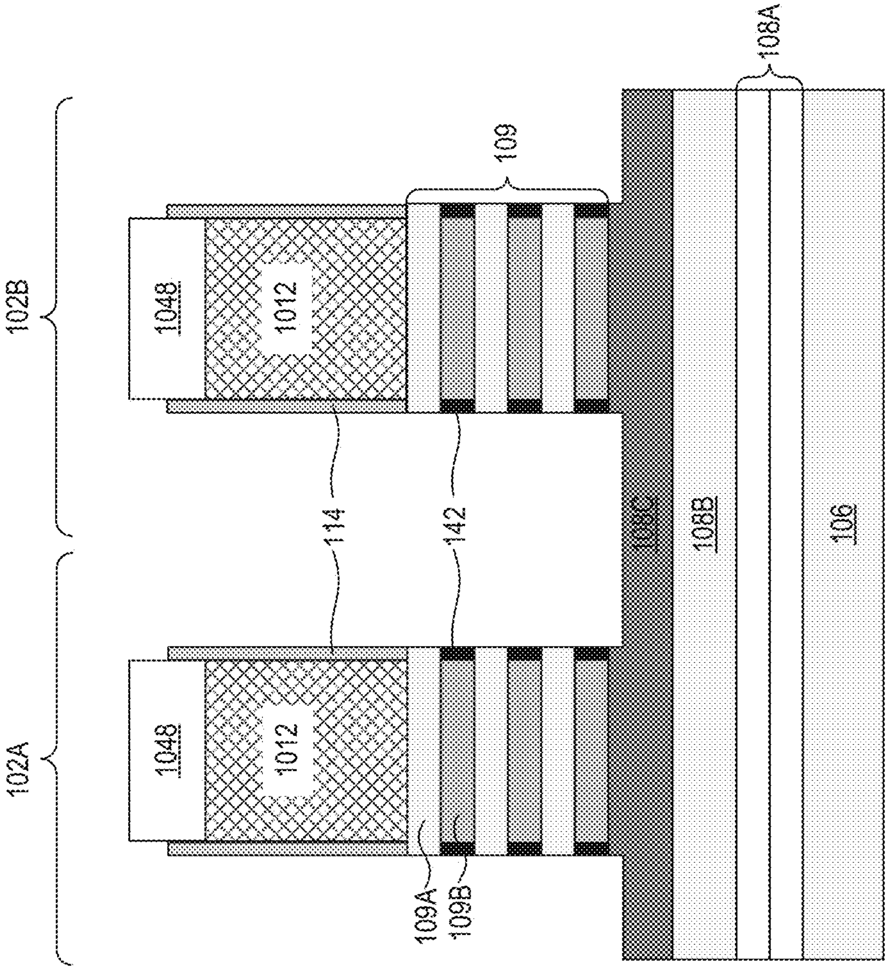
Figure 13:
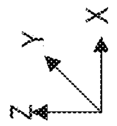
Figure 17:
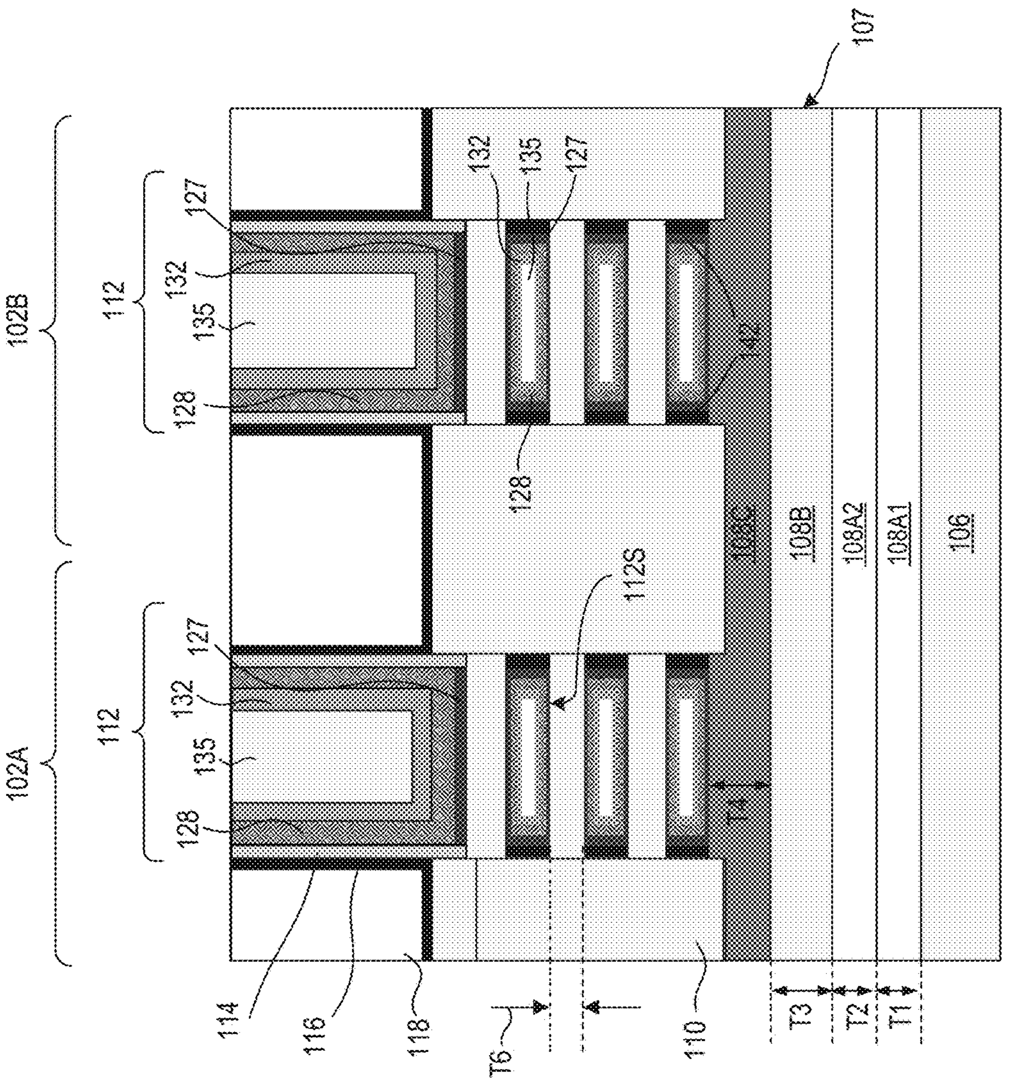

Referring to FIG. 2, in operation 240, epitaxial fin regions and GAA structures are formed on the fin structure. For example, as shown in FIG. 17, epitaxial fin regions 110 and GAA structures 112 are formed on fin structure 107. Prior to the formation of epitaxial fin regions 110, polysilicon gate structures 1012, gate spacers 114, and hard mask layers 1048 can be formed on the structure of FIG. 9, as shown in FIG. 10. The formation of epitaxial regions 110 can include sequential operations of (i) etching portions of superlattice structure 109 that are not covered by polysilicon gate structures 1012 and gate spacers 114 to form openings 1110, as shown in FIG. 11, (ii) etching back portions of nanostructured layers 109B that are under gate spacers 114 to form cavities 1242, as shown in FIG. 12, (iii) forming inner spacers 142 within cavities 1242, as shown in FIG. 13, and (iv) epitaxially growing epitaxial fin regions 110 on the sidewalls of nanostructured layers 109A to form the structure of FIG. 14. In some embodiments, the portions of channel isolation layer 108C within openings 1110 can be recessed (shown in FIG. 11) due to these portions being etched during the etching of superlattice structure 109. In some embodiments, the formation of epitaxial regions 110 can further include etching the recessed portions of channel isolation layer 108C within openings 1110, as shown in FIG. 18, when epitaxial fin regions 110 are epitaxially grown on semiconductor layer 108B, as shown in FIG. 1C.

The formation of GAA structures 112 can include sequential operations of (i) etching hard mask layers 1048 and polysilicon structures 1012 to form gate openings 1550, as shown in FIG. 15, (ii) etching nanostructured layers 109B through gate openings 1550 to form gate openings 1652, as shown in FIG. 16, and (iii) depositing IO layers 127, HK gate dielectric layers 128, WFM layers 132, and gate metal fill layers 135 within gate openings 1550-1652, as shown in FIG. 17.

The present disclosure provides example methods of forming FETs (e.g., FETs 102A-102B) with superlattice structures (e.g., superlattice structures 109) on a substrate with an embedded isolation structure (e.g., bi-layer isolation structure 108A). The embedded isolation structures can electrically isolate the FETs from other devices formed on or electrically connected to the substrate. In some embodiments, the embedded isolation structure can be disposed between a semiconductor layer (e.g., semiconductor layer 108B) and a wafer or a carrier wafer (e.g., substrate 106) of the substrate. The FETs with the superlattice structures can be formed on the semiconductor layer. Due to the high temperature fabrication process (e.g., at a temperature of about 600° C. to about 900° C.) of the superlattice structures, forming the superlattice structures without thermal damages (e.g., thermal agglomeration) to the microstructure of the semiconductor layer can be challenging.

The example method disclosed herein (e.g., method 200) can form the superlattice structures on the substrate without degrading the structural integrity of the semiconductor layer, consequently improving the device performance and reliability. In some embodiments, a method can include forming a stack with the superlattice structure formed on a sacrificial substrate (e.g., substrate 340) and the substrate with the embedded isolation structure formed on the superlattice structure. The formation of the substrate can be followed by flipping the stack such that the superlattice structure is disposed on the substrate and the sacrificial substrate is disposed on the superlattice structure. The flipping of the stack can be followed by the removal of the sacrificial substrate by a wafer thin down process and the formation of the FETs on the superlattice structure. Thus, with the use of the example method, the high temperature processing of the superlattice structure can be performed prior to the formation of the substrate and as a result, thermal damages to the semiconductor layer of the substrate can be prevented.

In some embodiments, a method includes forming an etch stop layer on a substrate, forming a superlattice structure on the etch stop layer, depositing an isolation layer on the superlattice structure, depositing a semiconductor layer on the isolation layer, forming a bi-layer isolation structure on the semiconductor layer, removing the substrate and the etch stop layer, etching the superlattice structure, the isolation layer, the semiconductor layer, and the bi-layer isolation structure to form a fin structure, and forming a gate-all-around structure on the fin structure.

In some embodiments, a method includes forming a fin structure on a substrate, forming a polysilicon structure on the superlattice structure, forming a source/drain region on the fin structure, removing the polysilicon structure and the second nanostructured layers to form gate openings, and forming a gate-all-around structure within the gate openings. The forming the fin structure includes forming a superlattice structure with first and second nanostructured layers on a sacrificial substrate, depositing an isolation layer on the superlattice structure, depositing a silicon layer on the isolation layer, forming a bi-layer isolation structure on the silicon layer, and removing the sacrificial substrate.

In some embodiments, a semiconductor device includes a substrate, a fin structure with a base structure disposed on the substrate and a superlattice structure disposed on the base structure, a source/drain region disposed on a second portion of the semiconductor layer, and a gate structure disposed on the superlattice structure. The base structure includes a bi-layer isolation structure disposed on the substrate, a semiconductor layer disposed on the bi-layer isolation structure, and a channel isolation layer disposed on a first portion of the semiconductor layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a substrate;
- a fin base structure, comprising:
  - a bi-layer isolation structure disposed on the substrate,
  - a semiconductor layer disposed on the bi-layer isolation structure, and
  - a channel isolation layer comprising a high-k dielectric layer disposed on the semiconductor layer;
- a superlattice structure disposed on the fin base structure;
- a source/drain (S/D) region disposed adjacent to the superlattice structure; and
- a gate structure disposed on the superlattice structure.

2. The semiconductor device of claim 1, wherein the bi-layer isolation structure comprises:
- a first dielectric layer disposed on the substrate, wherein the first dielectric layer comprises an oxide of a material of the substrate; and
- a second dielectric layer disposed on the first dielectric layer, wherein the second dielectric layer comprises an oxide of a material of the semiconductor layer.

3. The semiconductor device of claim 1, wherein the S/D region is disposed on and in contact with the channel isolation layer.

4. The semiconductor device of claim 1, wherein a sidewall of the S/D region is in contact with a sidewall of the channel isolation layer.

5. The semiconductor device of claim 1, wherein the S/D region is disposed on and in contact with the semiconductor layer.

6. The semiconductor device of claim 1, wherein the channel isolation layer is disposed on a first portion of the semiconductor layer; and
- wherein the S/D region is disposed on and in contact with a second portion of the semiconductor layer.

7. The semiconductor device of claim 1, wherein the semiconductor layer comprises a germanium layer or a silicon germanium layer.

8. The semiconductor device of claim 1, further comprising a contact structure disposed in the fin base structure and on the S/D region.

9. The semiconductor device of claim 1, wherein the channel isolation layer comprises a protruding region disposed under the superlattice structure.

10. The semiconductor device of claim 1, further comprising spacers on sidewalls of the superlattice structure, wherein bottom surfaces of the spacers are in contact with a top surface of the channel isolation layer.

11. A semiconductor device, comprising:
- a substrate;
- an isolation structure disposed on the substrate;
- a semiconductor layer disposed on the isolation structure;
- a channel isolation layer comprising a high-k dielectric layer disposed on the semiconductor layer;
- a nanostructured channel region disposed on the channel isolation layer;
- a gate structure surrounding the nanostructured channel region; and
- a source/drain (S/D) region disposed adjacent to the nanostructured channel region.

12. The semiconductor device of claim 11, wherein the isolation structure comprises:
- a first dielectric layer disposed on the substrate, wherein the first dielectric layer comprises an oxide of a material of the substrate; and
- a second dielectric layer disposed on the first dielectric layer, wherein the second dielectric layer comprises an oxide of a material of the semiconductor layer.

13. The semiconductor device of claim 11, wherein the S/D region is disposed on and in contact with the semiconductor layer.

14. The semiconductor device of claim 11, wherein the channel isolation layer is disposed on a first portion of the semiconductor layer; and
- wherein the S/D region is disposed on and in contact with a second portion of the semiconductor layer.

15. The semiconductor device of claim 11, further comprising a silicide layer disposed on the S/D region and on the channel isolation layer.

16. The semiconductor device of claim 11, further comprising spacers on sidewalls of the gate structure, wherein bottom surfaces of the spacers are in contact with a top surface of the channel isolation layer.

17. A semiconductor device, comprising:
- a substrate;
- an isolation structure disposed on the substrate;
- a silicon germanium layer disposed on the isolation structure;
- a high-k dielectric layer disposed on the silicon germanium layer;
- a first nanostructured layer disposed on the dielectric layer;
- a second nanostructured layer disposed on the first nanostructured layer;
- a gate structure disposed on the second nanostructured layer; and a source/drain (S/D) region disposed on the dielectric layer.

18. The semiconductor device of claim 17, wherein the isolation structure comprises an oxide of the silicon germanium layer.

19. The semiconductor device of claim 17, wherein the isolation structure comprises an oxide of a material of the substrate.

20. The semiconductor device of claim 17, wherein the first and second nanostructured layers comprise semiconductor materials different from each other.

* * * * *